(12) United States Patent
Conley et al.

(10) Patent No.: US 9,946,468 B2
(45) Date of Patent: Apr. 17, 2018

(54) REWRITABLE MULTIBIT NON-VOLATILE MEMORY WITH SOFT DECODE OPTIMIZATION

(71) Applicant: SanDisk Technologies LLC, Plano, TX (US)

(72) Inventors: Kevin Michael Conley, San Jose, CA (US); Raul-Adrian Cernea, Santa Clara, CA (US); Eran Sharon, Rishon Lezion (IL); Idan Alrod, Herzliya (IL)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/459,578

(22) Filed: Mar. 15, 2017

(65) Prior Publication Data

US 2017/0185299 A1   Jun. 29, 2017

Related U.S. Application Data

(62) Division of application No. 15/204,265, filed on Jul. 7, 2016, now Pat. No. 9,640,253, which is a division
(Continued)

(51) Int. Cl.
*G11C 16/26* (2006.01)
*G06F 3/06* (2006.01)
*G11C 11/56* (2006.01)
*G11C 16/08* (2006.01)
*G11C 16/04* (2006.01)
(Continued)

(52) U.S. Cl.
CPC ............ *G06F 3/061* (2013.01); *G06F 3/0619* (2013.01); *G06F 3/0659* (2013.01); *G06F 3/0679* (2013.01); *G06F 11/1068* (2013.01); *G11C 11/5628* (2013.01); *G11C 11/5635* (2013.01); *G11C 11/5642* (2013.01);
(Continued)

(58) Field of Classification Search
CPC ....................................................... G11C 16/26
USPC ..................................................... 365/185.18
See application file for complete search history.

(56) References Cited

U.S. PATENT DOCUMENTS 6,856,546 B2   2/2005   Guterman et al.
7,218,570 B2   5/2007   So et al.
(Continued)

OTHER PUBLICATIONS

European Search Report dated Apr. 19, 2016, European Patent Application No. 15189128.0.
(Continued)

*Primary Examiner* — Son Mai
(74) *Attorney, Agent, or Firm* — Vierra Magen Marcus LLP

(57) ABSTRACT

A non-volatile memory system including multi-level storage optimized for ramp sensing and soft decoding is provided. Sensing is performed at a higher bit resolution than an original user data encoding to improve the accuracy of reading state information from non-volatile storage elements. Higher resolution state information is used for decoding the original user data to improve read performance through improved error handling. Ramp sensing is utilized to determine state information by applying a continuous input scanning sense voltage that spans a range of read compare points. Full sequence programming is enabled as is interleaved coding of the user data over all of the data bit sets associated with the storage elements.

11 Claims, 17 Drawing Sheets

Related U.S. Application Data of application No. 14/563,820, filed on Dec. 8, 2014, now Pat. No. 9,406,377.

(51) Int. Cl.
  *G11C 16/34* (2006.01)
  *G06F 11/10* (2006.01)
  *G11C 29/52* (2006.01)

(52) U.S. Cl.
  CPC .......... *G11C 16/0483* (2013.01); *G11C 16/08* (2013.01); *G11C 16/3459* (2013.01); *G11C 29/52* (2013.01)

(56) References Cited

U.S. PATENT DOCUMENTS

| | | |
|---|---|---|
| 7,533,328 B2 | 5/2009 | Alrod et al. |
| 7,551,477 B2 | 6/2009 | Mokhlesi |
| 7,679,965 B2 | 3/2010 | Lasser |
| 7,681,109 B2 | 3/2010 | Litsyn et al. |
| 7,715,235 B2 | 5/2010 | Cernea |
| 7,751,237 B2 | 7/2010 | Alrod et al. |
| 7,813,181 B2 | 10/2010 | Cernea |
| 7,814,401 B2 | 10/2010 | Alrod et al. |
| 7,876,621 B2 | 1/2011 | Sharon et al. |
| 7,900,102 B2 | 3/2011 | Sokolov et al. |
| 7,944,754 B2 | 5/2011 | Cernea |
| 7,966,546 B2 | 6/2011 | Mokhlesi et al. |
| 7,966,550 B2 | 6/2011 | Mokhlesi et al. |
| 7,975,209 B2 | 7/2011 | Chin et al. |
| 7,990,764 B2 | 8/2011 | Alrod et al. |
| 7,990,767 B2 | 8/2011 | Sharon et al. |
| 8,023,334 B2 | 9/2011 | Hoei et al. |
| 8,099,652 B1 | 1/2012 | Alrod et al. |
| 8,154,918 B2 | 4/2012 | Sharon et al. |
| 8,156,403 B2 | 4/2012 | Shalvi et al. |
| 8,233,324 B2 | 7/2012 | Sharon et al. |
| 8,261,157 B2 | 9/2012 | Litsyn et al. |
| 8,301,979 B2 | 10/2012 | Sharon et al. |
| 8,385,117 B2 * | 2/2013 | Sakurada ............ G11C 11/5642 365/185.03 |
| 8,456,911 B2 | 6/2013 | Yuan et al. |
| 8,458,563 B2 | 6/2013 | Sharon et al. |
| 8,464,131 B2 | 6/2013 | Sharon et al. |
| 8,473,809 B2 | 6/2013 | Wan et al. |
| 8,508,989 B2 | 8/2013 | Alrod et al. |
| 8,509,000 B2 | 8/2013 | Sharon et al. |
| 8,621,157 B2 | 12/2013 | Loh |
| 8,743,618 B1 | 6/2014 | Kamei et al. |
| 8,885,416 B2 | 11/2014 | Mui et al. |
| 9,036,415 B2 | 5/2015 | Nagamo et al. |
| 9,082,502 B2 | 7/2015 | Dunga et al. |
| 9,208,883 B2 | 12/2015 | Alsmeier |
| 9,245,637 B2 | 1/2016 | Yang et al. |
| 2011/0066902 A1 | 3/2011 | Sharon et al. |
| 2012/0210082 A1 | 8/2012 | Sharon et al. |
| 2012/0224420 A1 | 9/2012 | Sakurada et al. |
| 2012/0224421 A1 * | 9/2012 | Litsyn .................... G11C 16/08 365/185.03 |
| 2013/0024746 A1 | 1/2013 | Sharon et al. |
| 2013/0058164 A1 | 3/2013 | Moschiano et al. |
| 2013/0103891 A1 | 5/2013 | Brusselle et al. |
| 2013/0191579 A1 | 7/2013 | Sharon et al. |
| 2013/0294157 A1 * | 11/2013 | Sharon ................ G06F 11/1072 365/185.03 |
| 2013/0315397 A1 | 11/2013 | Tuers et al. |
| 2014/0003152 A1 | 1/2014 | Sharon et al. |
| 2014/0068379 A1 * | 3/2014 | Sakaue ............... G06F 11/1012 714/764 |
| 2014/0071761 A1 | 3/2014 | Sharon et al. |
| 2015/0293813 A1 | 10/2015 | Lin et al. |
| 2016/0163382 A1 | 6/2016 | Conley et al. |

OTHER PUBLICATIONS

Restriction Requirement dated Nov. 19, 2015, U.S. Appl. No. 14/563,820, filed Dec. 8, 2014.
Response to Restriction Requirement dated Jan. 19, 2016, U.S. Appl. No. 14/563,820, filed Dec. 8, 2014.
Notice of Allowance dated Mar. 28, 2016, U.S. Appl. No. 14/563,820, filed Dec. 8, 2014.
Notice of Allowance dated Jan. 4, 2017, U.S. Appl. No. 15/204,265, filed Jul. 7, 2016.
Amendment under 37 CFR 1.312 dated Mar. 15, 2017, U.S. Appl. No. 15/204,265, filed Jul. 7, 2016.
European Office Action dated Mar. 29, 2017, European Patent Application No. 15189128.0.

* cited by examiner

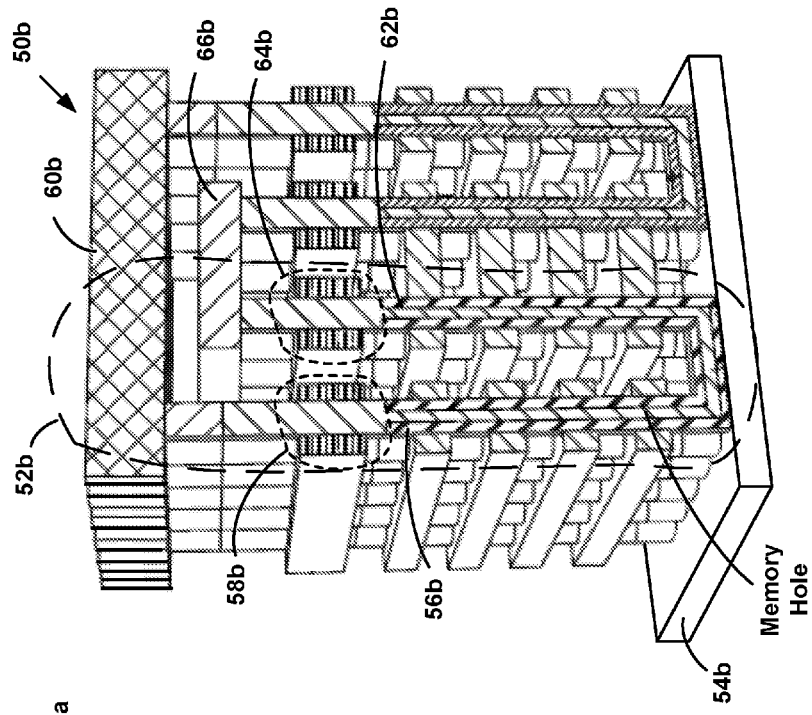
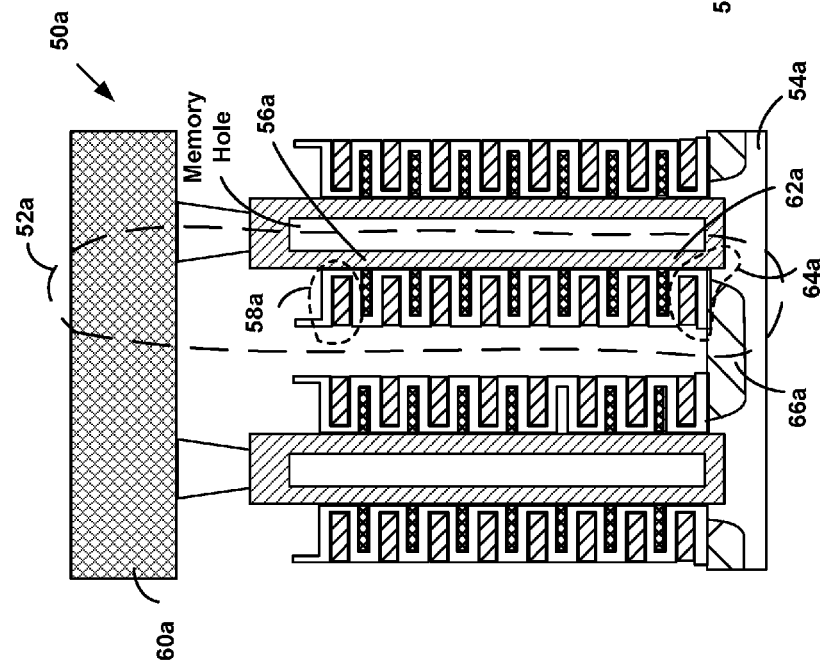

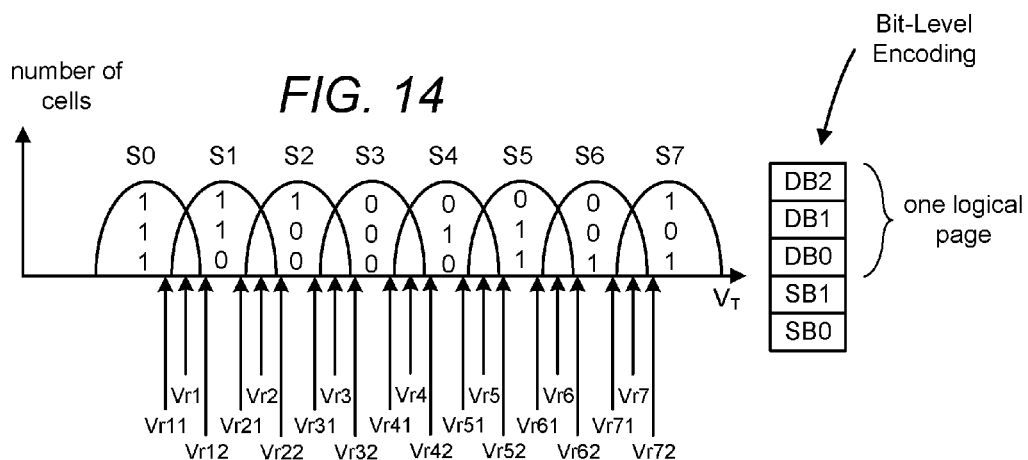
FIG. 14
| upper | ECC1 | ECC4 | ECC7 | ECC10 |
| --- | --- | --- | --- | --- |
| middle | ECC2 | ECC5 | ECC8 | ECC11 |
| lower | ECC3 | ECC6 | ECC9 | ECC12 |
FIG. 15
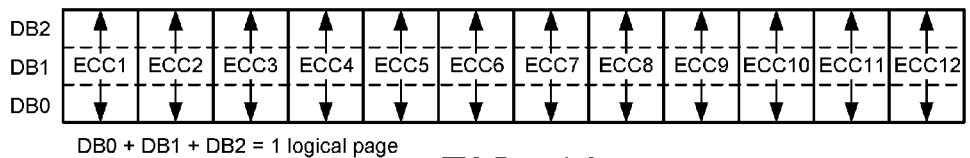
DB0 + DB1 + DB2 = 1 logical page
FIG. 16

FIG. 17
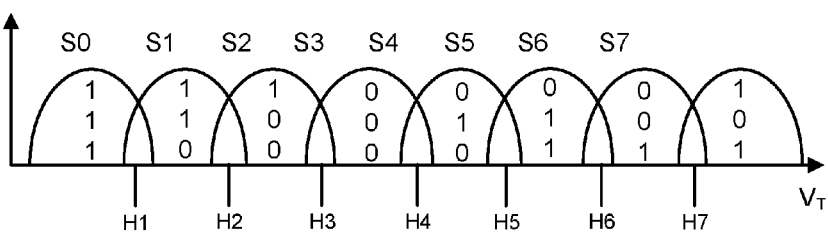
(A) Non-interleaved coding
0SB
Transfer 3 Pages/WL
Page BER<~0.7%
upper page
middle page
lower page
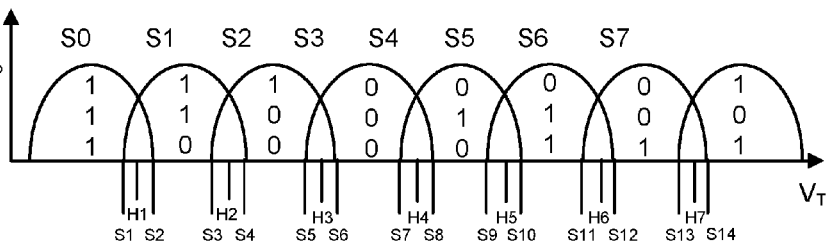
(B) Non-interleaved coding
1SB
Transfer 6 Pages/WL
Worst Page BER<~1.6%
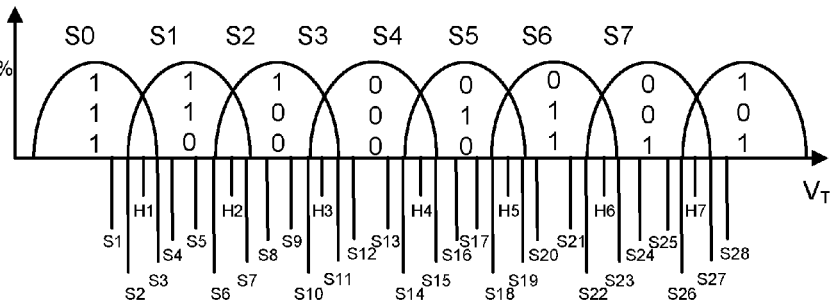
(C) Non-interleaved coding
2SB
Transfer 9 Pages/WL
Worst Page BER<1~1.8%

US 9,946,468 B2

REWRITABLE MULTIBIT NON-VOLATILE MEMORY WITH SOFT DECODE OPTIMIZATION

CLAIM OF PRIORITY

This application is a divisional application of U.S. patent application Ser. No. 15/204,265, entitled "REWRITABLE MULTIBIT NON-VOLATILE MEMORY WITH SOFT DECODE OPTIMIZATION," filed Jul. 7, 2016 and issued May 2, 2017 as U.S. Pat. No. 9,640,253, which is a divisional application of U.S. patent application Ser. No. 14/563,820, entitled "REWRITABLE MULTIBIT NON-VOLATILE MEMORY WITH SOFT DECODE OPTIMIZATION," filed Dec. 8, 2014 and issued Aug. 2, 2016 as U.S. Pat. No. 9,406,377, both of which are incorporated herein by reference in their entirety.

BACKGROUND OF THE INVENTION

The present disclosure is directed to non-volatile memory technology.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (VTH) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM applied to the control gate during a program operation is applied as a series of pulses that increase in magnitude over time. In one possible approach, the magnitude of the pulses is increased with each successive pulse by a predetermined step size, e.g., 0.2-0.4V. VPGM can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common for to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data.

BRIEF DESCRIPTION OF THE DRAWINGS

FIGS. 4A and 4B are cross-sectional and perspective views of a three-dimensional NAND memory array.

FIG. 14 is a graph depicting an example of a distribution of threshold voltages for a population of memory cells, each storing three bits of data using interleaved coding.

FIG. 15 is a block diagram describing ECC sectors for a group of memory cells with non-interleaved coding.

FIG. 16 is a block diagram describing ECC sectors for a group of memory cells with interleaved coding.

FIG. 17 depicts graphs of examples of a distribution of threshold voltages for a population of memory cells, each storing three bits of data using non-interleaved coding.

DETAILED DESCRIPTION

Figure 1:
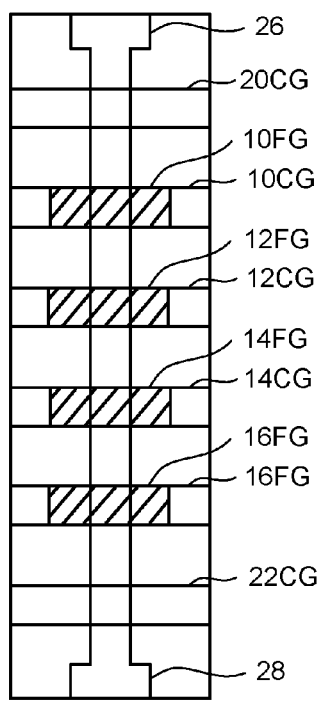
FIG. 1 is a top view of an example of a NAND string.

A non-volatile memory system including multi-level storage optimized for ramp sensing and soft decoding is provided. Sensing is performed at a higher bit resolution than an original user data encoding to improve the accuracy of reading state information from non-volatile storage elements. The higher resolution state information is used for decoding the original user data to improve read performance through improved error handling. Ramp sensing is utilized to determine state information by applying a continuous input scanning sense voltage that spans a range of read compare points. Full sequence programming is enabled as is interleaved coding of the user data over all of the data bit sets associated with the storage elements.

In one example, a non-volatile memory array and controller are provided that determine state information during read operations having a bit resolution that exceeds the number of bits originally encoded in each of the non-volatile storage elements. The additional bit resolution may be referred to as soft information. The soft information is used during reading and verification to decode the original user data, also referred to as hard bits or hard information. In one embodiment, the higher bit resolution information is determined during each read from the non-volatile memory. In another example, the higher resolution information may be selectively extracted, for example due to errors, or extracted during read operations after the memory has undergone write/erase cycling.

In one example, the ramp sensing is utilized for every read and verify operation to determine the higher bit resolution information for decoding attempts. In traditional step-based sensing, a sense operation is performed for each read reference level used. With ramp sensing, one input scanning sense voltage can be applied having level that sweeps through all of the read compare points in a single sense operation. The threshold voltage of each non-volatile storage element is determined by time-domain sensing while applying the scanning sense voltage. Time-domain sensing uses a correlation between the scanning sense voltage level and the time when the memory cell discharges the bit line to determine the threshold voltage of the memory cell. Because a ramp voltage signal is applied, the system determines actual state information for the memory cell during a single sensing period. In this manner, sensing at a higher resolution than an original encoding can be performed without undue increases in sense time.

In one embodiment, the system determines an index for each memory cell based on the sensed threshold voltage of the memory cell. The index includes a number of bits that exceeds the number of bits of the user data encoded in the memory cell. In this manner, the index provides a higher bit resolution than the user data encoding. The memory transfers the higher bit resolution information to the controller. The controller performs an initial decode of the user data using a number of bits that is larger than the number of bits programmed for each memory cell.

Programming is optimized for ramp sensing during read operations in one embodiment. Interleaved coding is used to spread user data across multiple bits for each of the memory cells. For example, a logical page division can be provided that includes each of the data bits for a memory cell in a single logical page. Each data bit is part of a data bit set for a word line so that each memory cell is associated with a plurality of data bit sets. These data bit sets may span an entire word line or less than an entire word line. User data is then encoded over all of the data bit sets for a word line. The system applies data shaping and optimizations at the cell level for all data bits, rather than for a single bit of each cell as with encodings when a memory cell stores multiple logical pages. The system can control the entirety of data for a memory cell or word line for purposes of encoding and intercell interference compensation. This can be contrasted with traditional approaches that operate on a multiple logical page per cell basis such that encoding and intercell interference compensation can only be applied on a single logical page and not on a final data encoding. In these systems, a cell may store data for more than one logical page such that the data within a single cell is not optimized together, but instead separately according to the logical page of which it is a part.

A system in one embodiment provides a plurality of hard data bit sets that are associated with each word line. With the use of a plurality of hard data bits that are programmed together for each memory cell, the memory system permits data scrambling across each of the hard data bit sets. The system applies intercell interference compensations across the plurality of hard data bit sets. For example, the system may transform the user data to minimize or otherwise reduce the number of adjacent cells along a word line that contain significantly different programming levels. The system may also apply precompensations to the data to minimize the coupling effects between adjacent cells on different word lines or bit lines. The precompensation may result in a number of bits transferred from the controller to the non-volatile memory that is larger than the original user data. For example, the system may determine that a particular cell should be programmed with a lower verify level for its target state due to coupling the cell will later experience.

The controller may perform various operations with respect to the hard and soft information. For example, the index may be used to determine values that are input to an error correction control (ECC) engine to determine the hard data bits. The input values can be modified based on various parameters including program erase cycles, temperate, data retention characteristics, etc. These values may also be modified based on the threshold voltage information for neighboring memory cells if this information is known. Additionally, the controller may use soft-bit decoding based on the index values form the memory cells. For example, the number of bits in each index value is larger than the actual number of data bits stored in each cell. These additional bits are additional information that can be used to decode the data bits for each cell. These bits may provide soft information that improves the determination of initial LLR (logarithmic likelihood ratios) values for LDPC decoding. Moreover, the values for the LLR tables are based on all of the hard data bits sets associated with a group of memory cells. In this manner, a better basis for soft decision making in the LDPC decode process can be made with enhancements to error rate performance.

Figure 2:
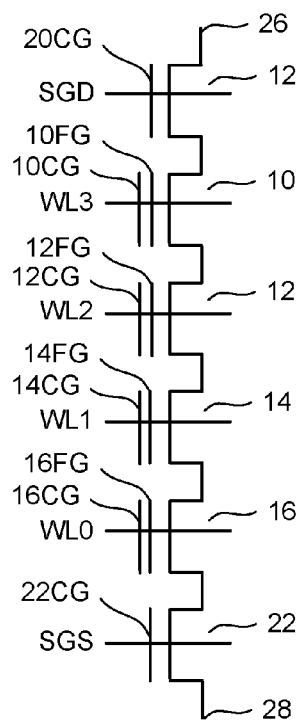
FIG. 2 is an equivalent circuit diagram of the NAND string of FIG. 1.

One example of a flash memory system uses the NAND structure, which includes multiple transistors arranged in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Other types of non-volatile memory in addition to NAND flash memory can also be used in accordance with embodiments.

Figure 3:
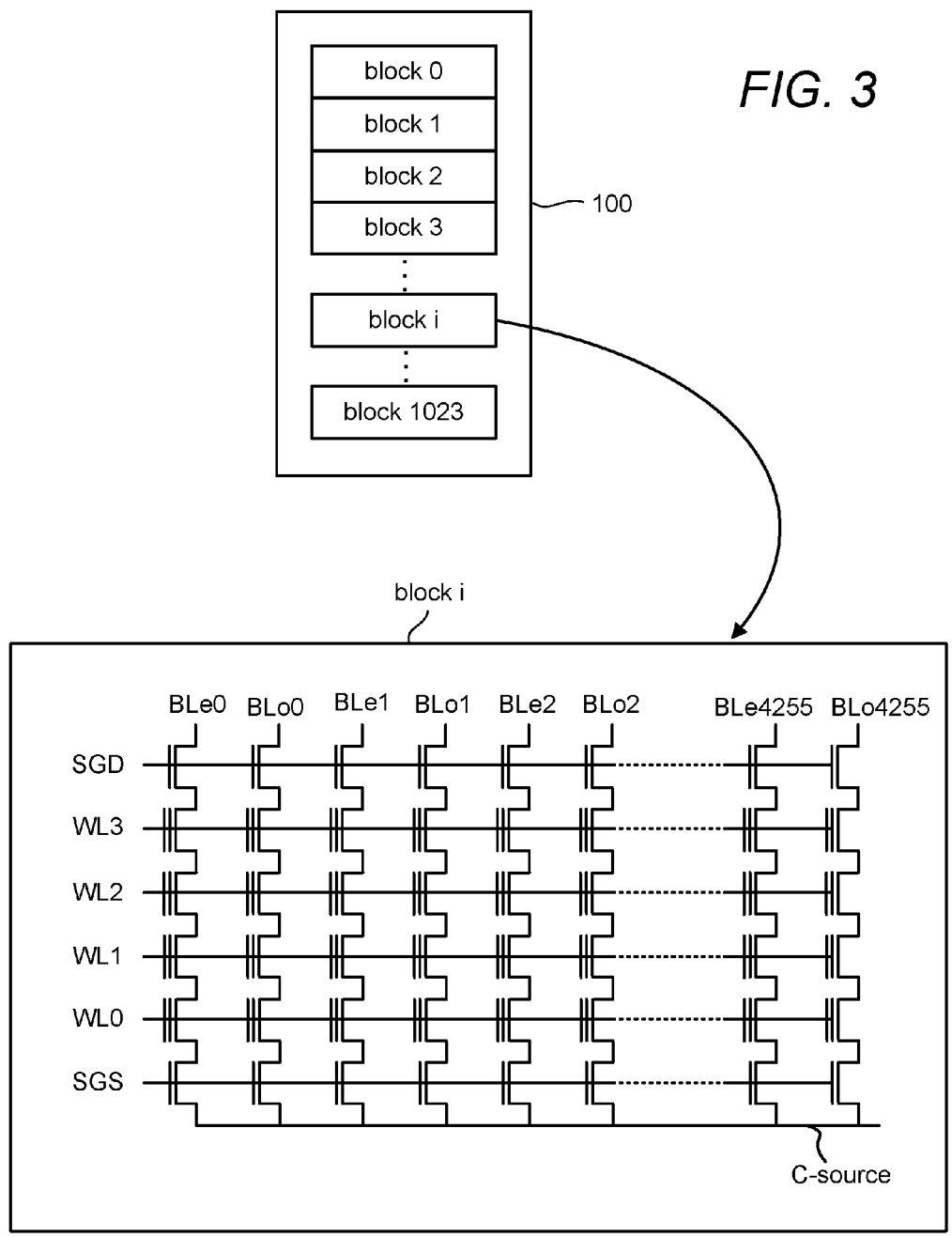
FIG. 3 is a block diagram of an example of an array of NAND flash storage elements.

Typical architectures for flash memory using NAND structures include many NAND strings. FIG. 3 illustrates an exemplary array 100 of NAND strings, such as those shown in FIGS. 1 and 2. The array 100 of memory cells is divided into a large number of blocks of memory cells. As is common for flash EEPROM systems, the block is the unit of erase and may be referred to as an erase block or physical block. Each block can contain the minimum number of memory cells that are erased together, although multiple blocks may be erased simultaneously. Smaller units of cells may be erased together in some implementations.

Each block of memory cells includes a set of bit lines forming columns and a set of word lines forming rows. Each block is typically divided into a number of pages. A page is typically a minimum unit of programming or reading, although more than one page may be programmed or read in a single operation. In another embodiment, the individual pages may be divided into segments and the segments may contain the fewest number of cells that are written at one time as a basic programming operation. One or more pages of data are typically stored in one row of memory cells. A page can store one or more sectors of data, the size of which is generally defined by a host system. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than those of the user data to which they pertain. A sector of user data is typically 512 bytes, corresponding to the size of a sector commonly used in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Although four cells are included in each NAND string of FIG. 3, more or less than four can be used (e.g., 16, 32, or another number). One terminal of the NAND string is connected to a corresponding bit line via a first select gate (connected to select gate drain line SGD), and another terminal is connected to a common source line c-source via a second select (connected to select gate source line SGS). In each block of this example, there are 8,512 columns that are divided into even columns and odd columns. The bit lines are divided into even bit lines (BLe) and odd bit lines (BLo). In an odd/even bit line architecture, memory cells along a common word line and connected to the odd bit lines are programmed at one time, while memory cells along a common word line and connected to even bit lines are programmed at another time. In this example, 532 bytes of data can be read or programmed simultaneously and forms a logical page. Therefore, one block can store at least eight pages. When each memory cell stores two bits of data, a block would store 16 pages. Other sized blocks and pages can also be used, and architectures other than those of FIGS. 1-3 can be used in accordance with the present disclosure.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

FIGS. 4A-4B depict a three-dimensional NAND stacked non-volatile memory device including an array of alternating conductive and dielectric layers disposed above a substrate as may also be used in accordance with one embodiment. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 4A illustrates a TCAT (Terabit Cell Array Transistor) array 50a, and FIG. 4B illustrates a BiCS (Bit Cost Scalable) array 50b. TCAT array 50a includes a NAND string 52a disposed above a substrate 54a. NAND string 52a has a drain end 56a coupled via SGD 58a to a bit line 60a, and a source end 62a coupled via SGS 64a to a source line 66a. BiCS array 110b includes a NAND string 112b disposed above a substrate 114b. NAND string 52b has a drain end 56b coupled via SGD 58b to a bit line 60b, and a source end 62b coupled via SGS 64b to a source line 66b.

Select gates SGD 116a and SGS 120a, and SGD 16b and SGS 120b are implemented above substrates 114a and 114b, respectively. SGD 116a and SGS 120a, and SGD 116b and SGS 120b consume a significant amount of area. Other 3D NAND non-volatile memory devices may include include select gate transistors (SGD or SGS) disposed in the substrate below the NAND strings. In particular, 3D NAND memory arrays may include include buried word lines as selector devices of select gate transistors (SGD or SGS).

Figure 5:
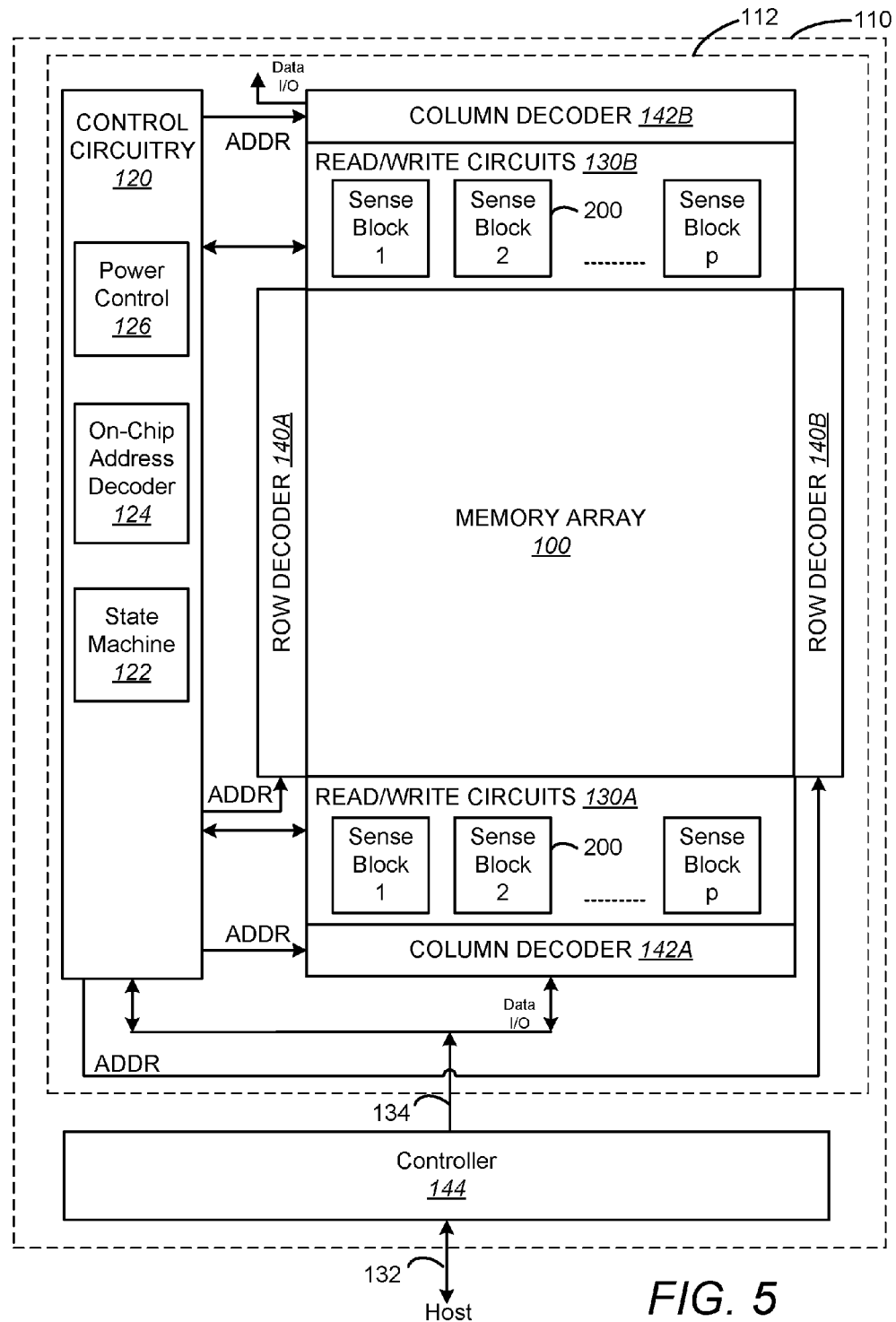
FIG. 5 is a block diagram of a non-volatile memory system in accordance with one embodiment.

FIG. 5 illustrates a memory device 110 having read/write circuits for reading and programming a page of memory cells in parallel. Memory device 110 may include one or more memory die or chips 112. Memory die 112 includes a two-dimensional or three-dimensional array of memory cells 100. Control circuitry 120 and read/write circuits 130A and 130B are provided. In the embodiment of FIG. 5, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations.

Figure 6:
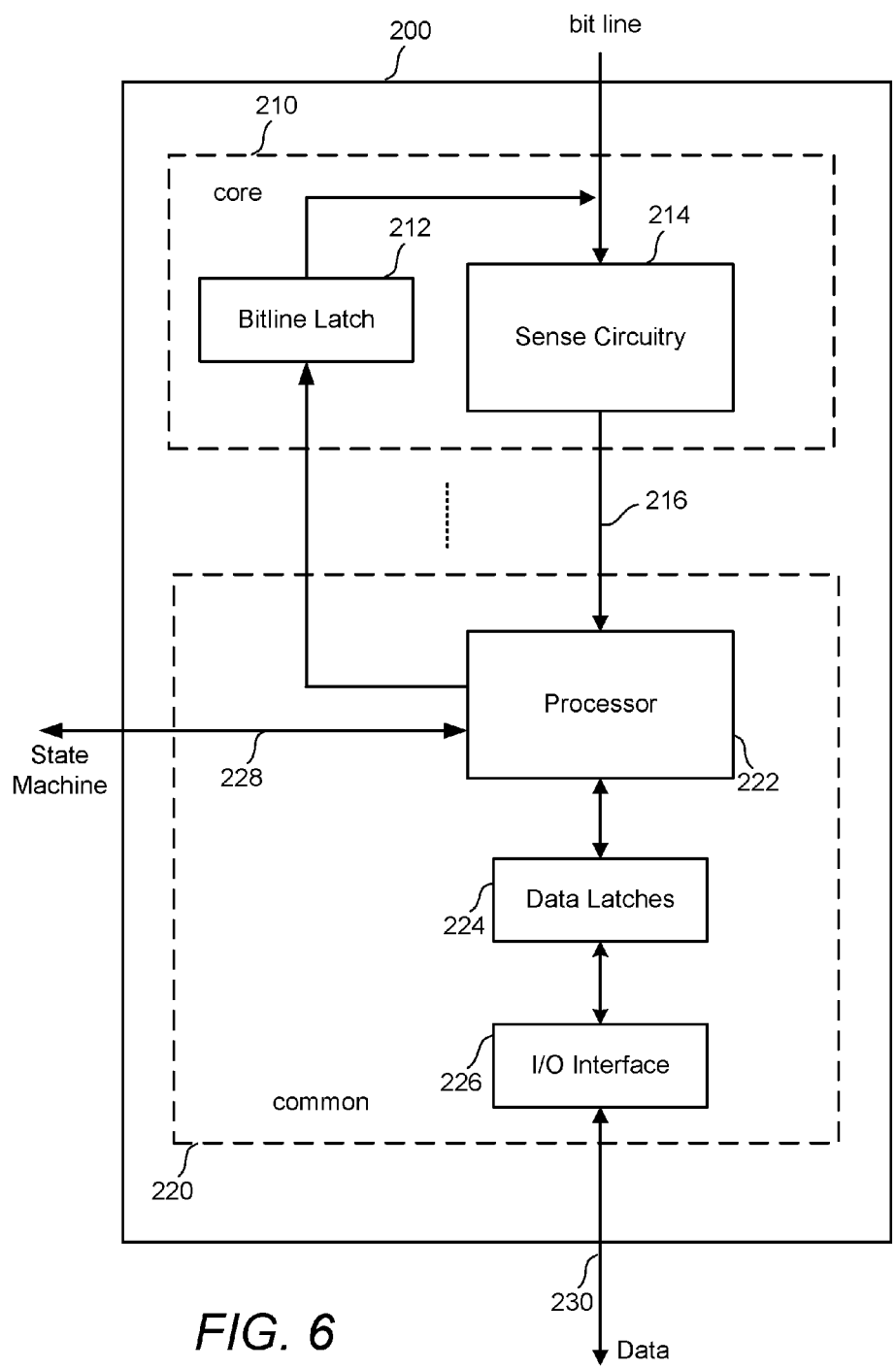
FIG. 6 is a block diagram of a sense block in accordance with one embodiment.

FIG. 6 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., VDD).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. During convention sensing, the state machine steps through the various predefined control gate voltages corresponding to the various memory states supported by the memory. The sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 7:
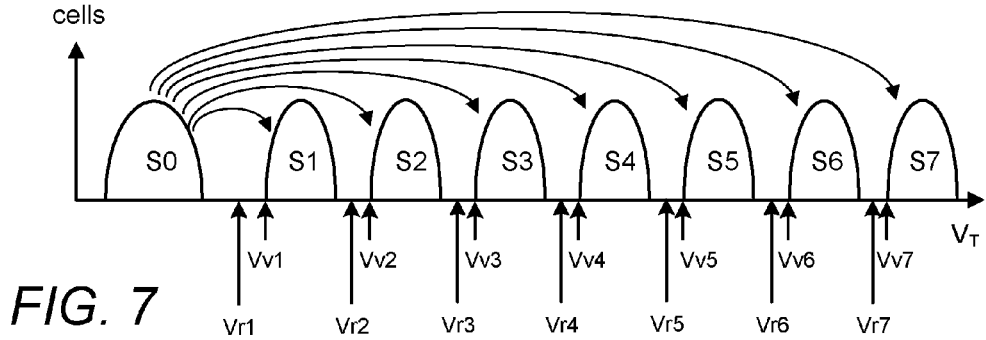
FIG. 7 is a graph depicting an example of a distribution of threshold voltages for a population of memory cells, each storing three bits of data.

At the end of a successful programming process (with verification), the threshold voltages of the memory cells should be within one or more distributions of threshold voltages for programmed memory cells or within a distribution of threshold voltages for erased memory cells, as appropriate. FIG. 7 depicts example threshold voltage distributions for states of memory cells in which there are eight states. The eight data states include an erase state S0 and programmed states S1-S7. In this example, three bits may be stored per memory cell. Between each of the data states are read reference voltages or levels used for reading data from memory cells. For example, FIG. 7 shows read reference voltage Vra between data states erase and S0, and Vrb between data states A and B. By determining whether the threshold voltage of a given memory cell is above or below the respective read reference level, the system can determine what state the memory cell is in. At or near the lower edge of each data state are verify reference voltages. For example, FIG. 7 shows VvA for state A and VvB for state B, etc. When programming memory cells to a given state, the system will test whether those memory cells have a threshold voltage greater than or equal to the verify reference voltage.

Note also that although a distinct gap is depicted between each data state in FIG. 7 this may not be the case. For example, there may be some overlap between the threshold voltage distributions. In this case, error recovery may be used to correctly read the state of each memory cell.

FIG. 7 also depicts a full sequence programming technique where memory cells are programmed from the erase state S0 directly to any of the programmed states S1-S7. For example, a population of memory cells to be programmed may first be erased so that all memory cells in the population are in erased state S0. The process depicted in FIG. 7, using a control gate voltage sequence that includes increasing program voltage pulses followed by a verification of programming, will then be used to program memory cells directly into states S 1, S2, S3, S4, S5, S6, and S7. While some memory cells are being programmed from state S0 to state S1, other memory cells are being programmed from state S0 to state S2 and/or from state E to state S3, etc. In such embodiments, all of the bits coded for a particular memory state of a memory cell can be regarded as part of a single page of data.

Figure 8:
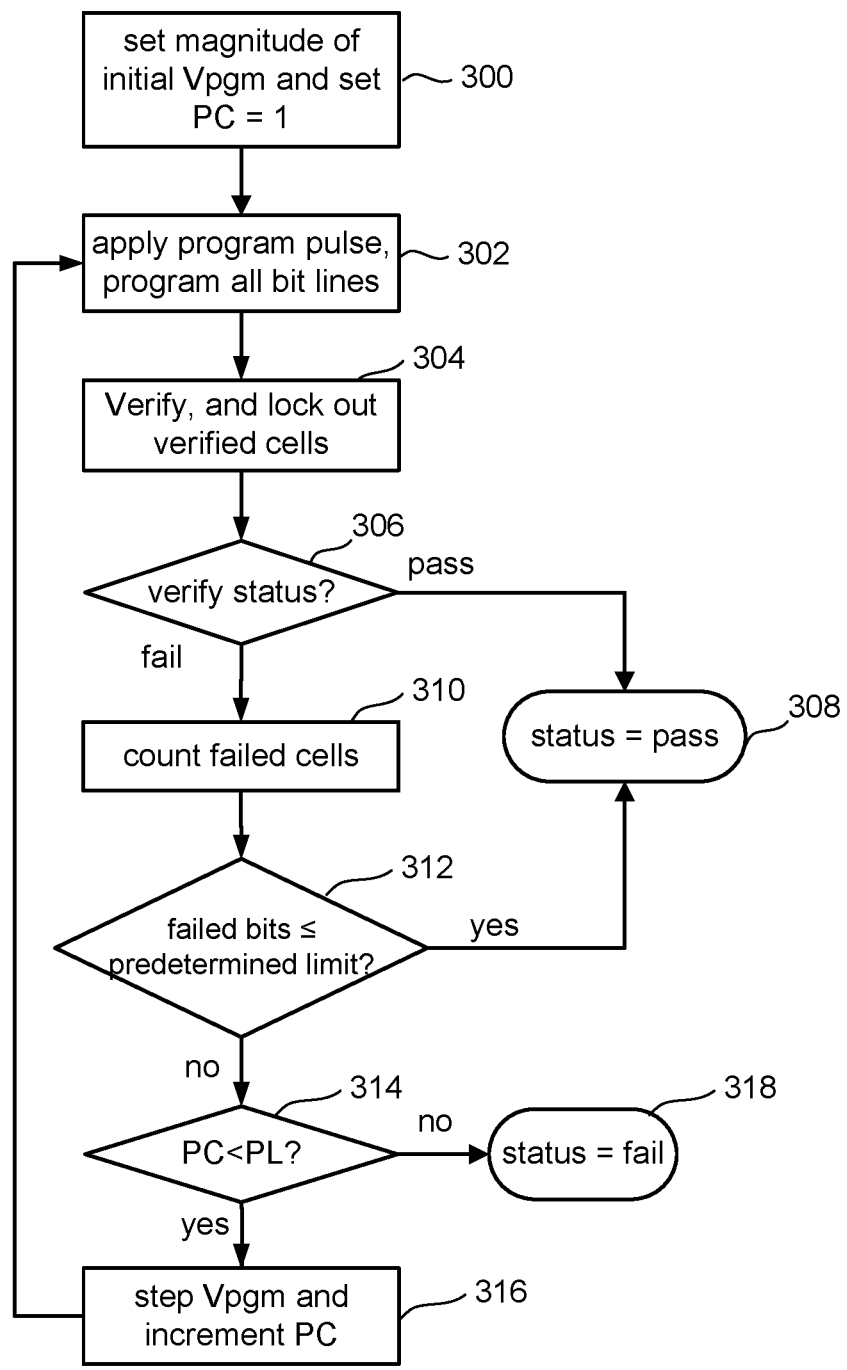
FIG. 8 is a flowchart describing a process of programming non-volatile memory in accordance with one embodiment.

FIG. 8 is a flow chart describing one embodiment of a process for performing programming on memory cells connected to a common word line to one or more targets (e.g., data states or threshold voltage ranges). For example, the process of FIG. 8 can be used to program memory cells using full sequence programming from state S0 directly to any of states S1-S7. Typically, the program voltage applied to the control gate during a program operation is applied as a series of program pulses. Between programming pulses traditionally a set of verify pulses are applied to perform verification. In accordance with one embodiment, ramp-based sensing is used for verification between programming pulses such that a single ramping sense voltage is applied in a single sense sequence.

In many implementations, the magnitude of the program pulses is increased with each successive pulse by a predetermined step size. In step 300 of FIG. 8, the programming voltage (Vpgm) is initialized to the starting magnitude (e.g., ~12-16V or another suitable level) and a program counter PC maintained by state machine 122 is initialized at 1. In step 302, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 302, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 304, the appropriate memory cells are verified using a ramp sense voltage to verify all of the memory cells for their respective target states in a single verify operation. In one embodiment, the verification process is performed by testing whether the threshold voltages of the memory cells selected for programming have reached the appropriate verify compare voltage (Vv1, Vv2, Vv3, Vv4, Vv5, Vv6, and Vv7). The ramp sense voltage sweeps from Vv1 to Vv7 and time-domain sensing is used to determine the value of the cell's threshold voltage when it began to conduct under application of the sense voltage. The value of the DAC that drives the sense voltage on the WL is determined by correlating the time at which the memory cell began to conduct.

In step 306, it is determined whether all the memory cells have reached their target threshold voltages (pass). If so, the programming process is complete and successful because all selected memory cells were programmed and verified to their target states. A status of "PASS" is reported in step 308. If, in 306, it is determined that not all of the memory cells have reached their target threshold voltages (fail), then the programming process continues to step 310.

In step 310, the system counts the number of memory cells that have not yet reached their respective target threshold voltage distribution. That is, the system counts the number of cells that have failed the verify process. This counting can be done by the state machine, the controller, or other logic. In one implementation, each of sense block 200 will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed. In one embodiment, there is one total count, which reflects the total number of memory cells currently being programmed that have failed the last verify step. In another embodiment, separate counts are kept for each data state.

In step 312, it is determined whether the count from step 310 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 308. In this situation, enough memory cells programmed correctly such that the few remaining memory cells that have not been completely programmed can be corrected using ECC during the read process. In some embodiments, step 310 counts the number of failed cells for each sector, each target data state or other unit, and those counts will individually or collectively be compared to a threshold in step 312.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 314 and the program counter PC is checked against the program limit value (PL). Examples of program limit values include 20 and 30; however, other values can be used. If the program counter PC is not less than the program limit value PL, then the program process is considered to have failed and a status of FAIL is reported in step 318. If the program counter PC is less than the program limit value PL, then the process continues at step 316 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 316, the process loops back to step 302 and another program pulse is applied to the selected word line.

At the end of a programming process the programmed memory cells will be in various data states, such as depicted in FIG. 7. FIG. 7 depicts an ideal threshold voltage distribution, with the data states separated by margins to allow the data to be accurately read. In many actual implementations, due to limitations from programming or from conditions/phenomena after programming, the data states can be overlapping as depicted in FIG. 14. For example, data state S0 overlaps with data state S1, data state S2 overlaps with data states S1 and S3, and so on.

Figure 9:
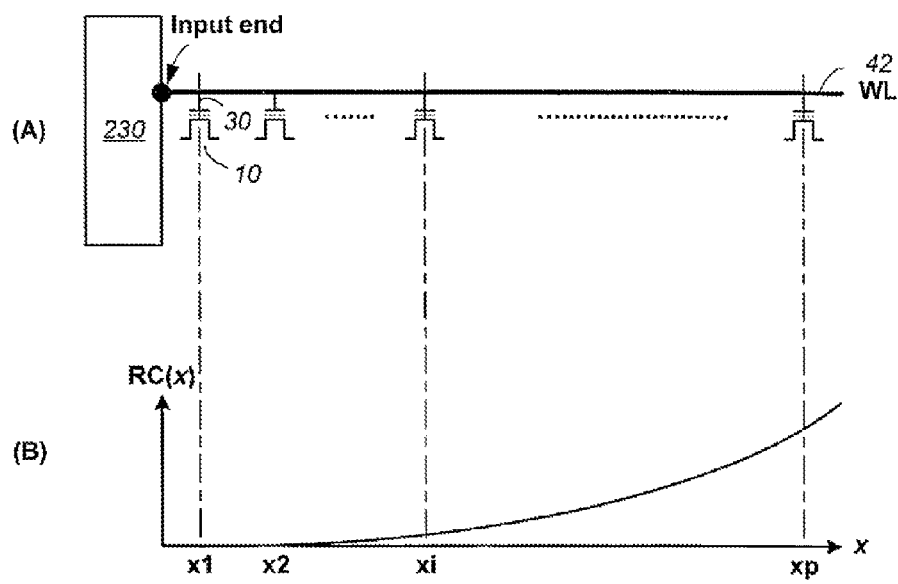
FIG. 9 illustrates a page of memory cells distributed along a word line at positions from an input end, and illustrates the product of resistance and capacitance of a given segment of the word line relative to the access node.
Figure 10:
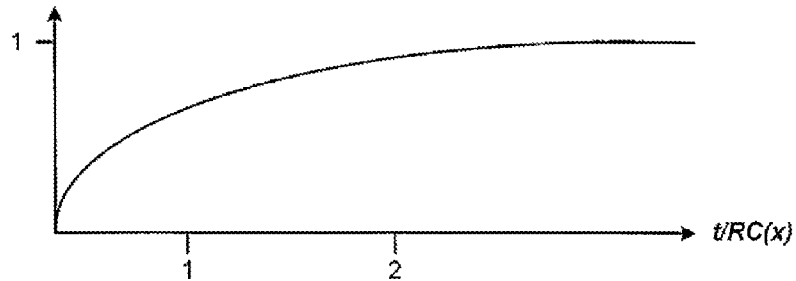
FIG. 10 illustrates the word line voltage for a given location as a function of time.
Figure 11:
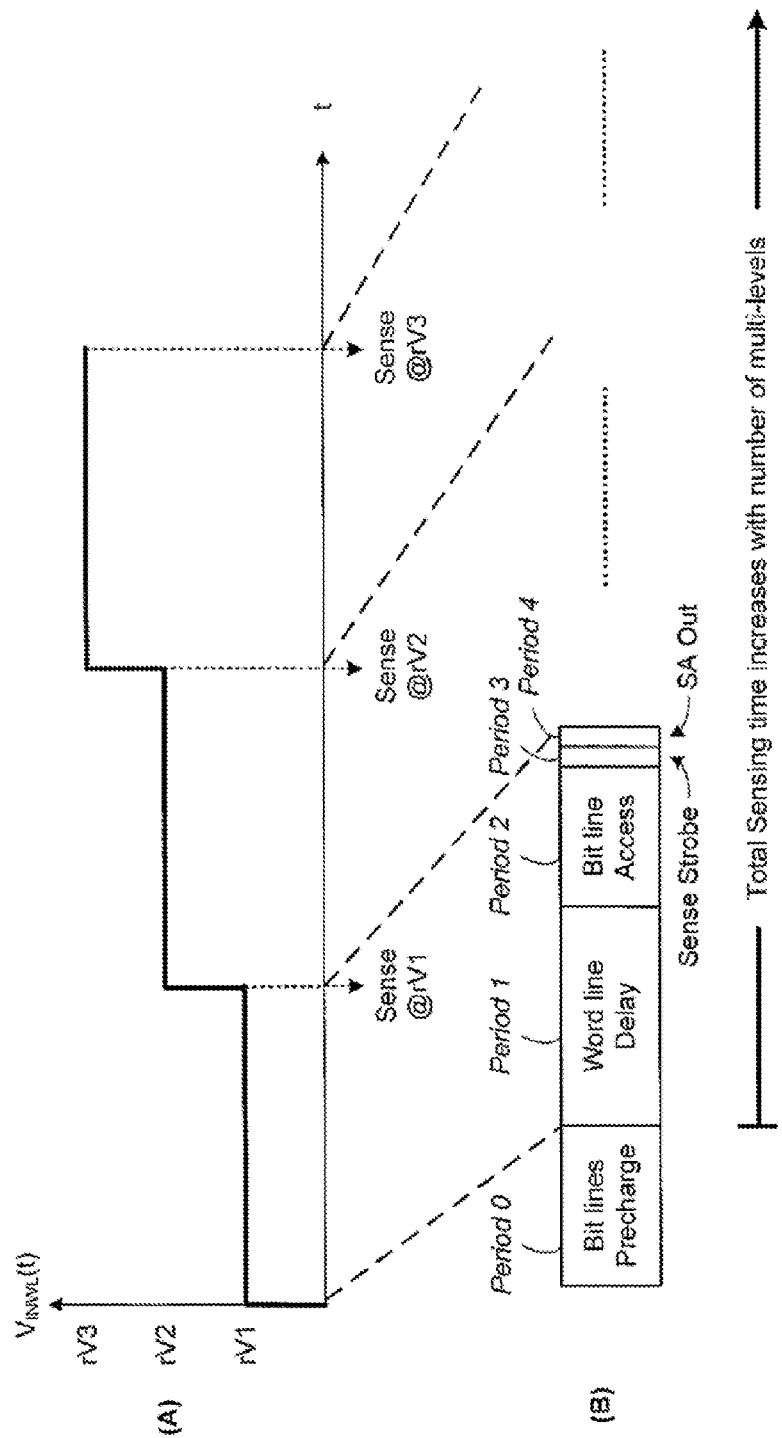
FIG. 11 illustrates that sensing can be accomplished by applying to a word line the sense voltage VWL which is a step function that steps through levels rV1, rV2, and rV3, and illustrates the timing for each sense level.

FIGS. 9-11 describe typically RC delays associated with sensing in non-volatile memories. FIG. 9 at (A) illustrates a page of memory cells distributed along a word line WL 42 at positions x1, x2, . . . , xi, . . . xp from an input end. The input end of the word line is coupled to receive a word line voltage supply from the x-decoder 230. FIG. 9 at (B) illustrates the product of resistance and capacitance of a given segment of the word line relative to the access node. The word line WL 42 is formed from a conductor with a finite resistance. The resistance of a segment of word line is proportional to the length of the segment. Similarly, the capacitance of a segment is also proportional to its length. Thus, the product of RC for a segment of the word line increases as a quadratic function of its length.

FIG. 10 illustrates the word line voltage for a given location xi as a function of time. The response to an input voltage at the input end is a charging up of a portion of the word line with time constant given by RC(xi). The charged up voltage at location xi and time t is VWL(xi, t)=VWL(x=0) [1−EXP(−t/RC)]. If later the input voltage is removed, the discharged voltage at location xi and time t is VWL(xi, t)=VWL(x=0) EXP(−t/RC). In general, the product RC(x) (see FIG. 9B) is a time constant that determines the rate of charging or discharging of the word line at location x. FIG. 10 illustrates the response word line voltage normalized to the input voltage and the time normalized to the RC time constant. After one unit of time constant, the word line will be charged to 63.2 percent. After two units of time constant, the word line will be charged to 86.5 percent, etc. Thus, the greater the RC, the slower will the charging and discharging be. The effect of the RC variation along a word line is that for those cells further away from the x-decoder, the RC delay is larger and therefore will take longer time to charge up.

An example partitioning of a 2-bit memory cell is shown in FIG. 11 at (A). The 2-bit cell can be in anyone of four memory states, each associated with a threshold range. In order to resolve in which of the threshold ranges the cell's threshold lies, sensing is performed three times, each time sensing relative to one of the read demarcation levels rV1, rV2 and rV3.

FIG. 11 illustrates typical timings for sensing a 2-bit memory cell. FIG. 11 at (A) shows that the sensing is accomplished by applying to the word line the sense voltage $V_{WL}$ which is essentially a step function that scans through levels rV1, rV2 and rV3. Owning to the RC delay in the word line sensing for the whole page can only take place when the far end of the word line has also charged up to the desired level.

FIG. 11 at (B) illustrates the timing for each sense level. In order to sense the page, the bit lines are set up with voltages appropriate for sensing operation in a bit line precharge Period 0. Sensing at rV1 level commences with application of the rV1 voltage level to the word line. After allowing for the word line delay Period 1, the word line is uniformly at the desired rV1 level. With the bit line and word line voltages set up, the cell is either turned on or off. If the cell is turned on, it means it has a threshold level of at least rV1. However, since sensing is performed by a sense amplifier in a sense module (see FIG. 6) remotely coupled to the cell via a bit line, the cell's conduction current will reach the sense amplifier after a bit line access Period 2. After that time, a sense strobe in sense Period 3 enables to sense amplifier to determine the conduction current. The sensed result is then output from the sense amplifier to a data latch in the next period which is the sense amp output Period 4.

Depending on various sensing implementations, the bit line precharge Period 0 may or may not be repeated for each of the sense levels. However, the Periods 1-4 must be repeated for each of the sense levels. An example illustrates the relative duration of each period. The sense Period 3 and output Period 4 are typically about 1 microsecond each; the word line delay and bit line access are typically about ten times longer at say, 10 microseconds each. This amounts to about 20 microseconds for each sensing levels. The initial bit lines precharge time may take another 10 microseconds. For a 2-bit cell, there are 22−1 or three levels and the total sensing time is 20×3+10=70 microseconds. For a 3-bit cell, there are 23−1 or 7 levels and the total sensing time is 20×7+10=150 microseconds. For a 4-bit cell, there are 15 levels and the total sensing time is 20×15+10=310 microseconds. It will be seen that most of the sensing time at each sense level is waiting for the word line and bit line delays, which is about one order of magnitude higher than the actual sense and output periods.

In one embodiment, a page of non-volatile multi-level memory cells on a word line is sensed in parallel by sense amps via bit lines. A predetermined input sensing voltage as an increasing function of time $V_{INWL}(t)$ applied to the word line allows scanning of the entire range of thresholds of the memory cell in one sweep. Sensing of the thresholds of individual cells is then reduced to a time-domain sensing by noting the times the individual cells become conducting. Each conducting time, adjusted for delays in the word line and the bit line, can be used to derive the sensing voltage level that developed at the portion of the word line local to the cell when the cell became conducting. This locally developed sensing voltage level yields the threshold of the cell.

In one embodiment, the voltage of the word line $V_{WL}(xi, t)$ as a function of cell position xi in response to the input $V_{INWL}(t)$ is predetermined. The page is sensed periodically and the time ti when the cell i begins to conduct is used to determine the threshold $V_{TH}i$ by evaluating the word line response function at (xi, ti), i.e. $V_{TH}i=V_{WL}(xi, ti)$.

Figure 12:
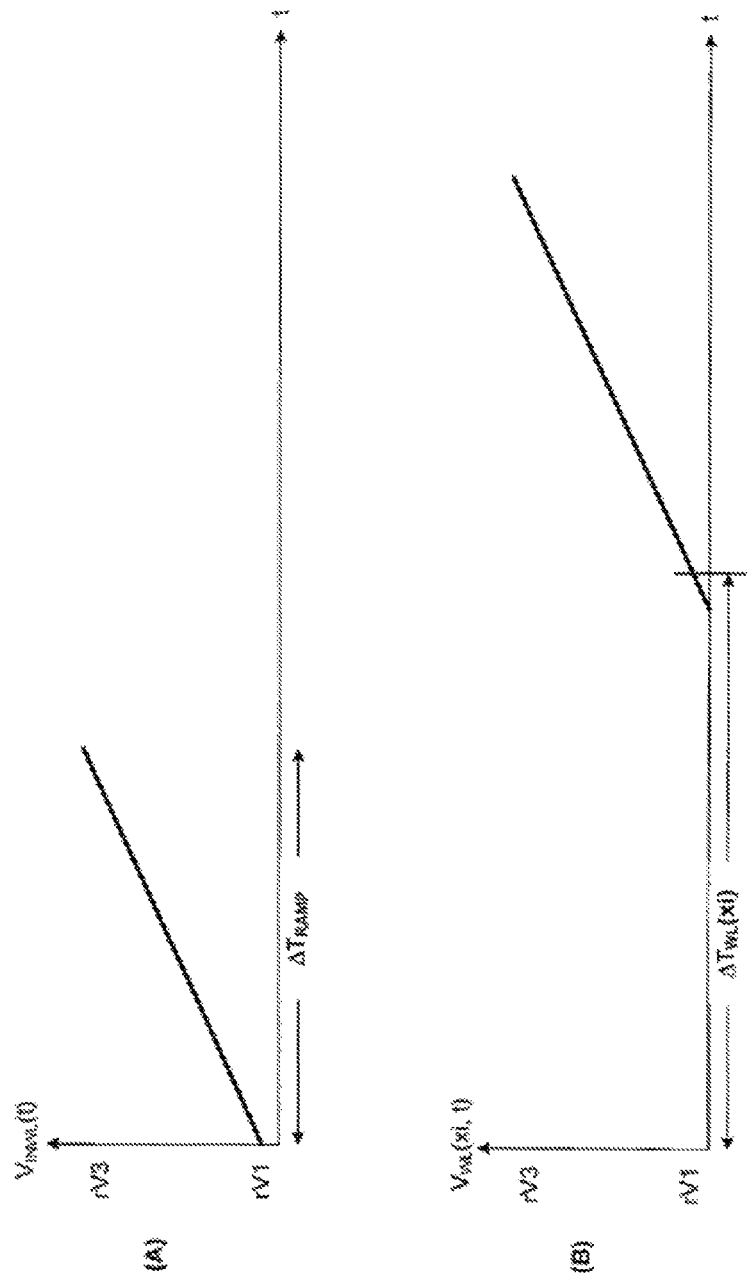
FIG. 12 illustrates an input continuous scanning voltage for sensing all of the levels of a multi-level memory cell, and illustrates the voltage response of a word line at a position from where the input scanning voltage is applied.

FIG. 12 at (A) illustrates an input continuous scanning voltage for sensing all the levels of a multi-level memory cell in one embodiment. The input scanning voltage $V_{INWL}(t)$ is a linear ramp voltage having a range inclusive of all the sense levels to be applied to the word line. It has a constant ramp rate and essentially scans through the range in a scanning period $\Delta T_{RAMP}$=Range/(ramp rate).

FIG. 12 at (B) illustrates the voltage response of a word line at position xi from where the input scanning voltage is applied. When the input scanning voltage $V_{INWL}(t)$ is input from the input end of a selected word line (see FIG. 9 at (A) and (B)), the voltage response of the word line at a distance xi from the input end is given by $V_{WL}(xi, t)$. Also, $V_{WL}(0, t)=V_{INWL}(t)$. When the ramp rate of the input scanning voltage is substantially less than the RC constant of the WL, then the voltage at xi is substantially the voltage at x=0 but delayed by $\Delta T_{WL}(xi)$. Thus, the word line voltage at xi is given by $V_{WL}(xi, t)$~$V_{INWL}(t-\Delta T_{WL}(xi))$. This is the voltage that will be presented to the control gate of the cell i located at xi.

In one embodiment, the word line response voltage $V_{WL}(xi, t)$ as a response function to the input voltage $V_{INWL}(t)$ can be obtained based on the RC model described in connection with FIG. 9 and FIG. 10. In another embodiment, the word line response voltage is obtained by simulation. In one embodiment, the response function can be implemented by a lookup table where a given time is used to look up a word line voltage at a given position.

Knowing the word line response to an input scanning voltage, the threshold of a cell i at position xi can be derived by determining the time when the cell begins to conduct. Thus a time marker ti indicates the time when the cell begins to conduct. At this time, the word line voltage at xi is $V_{WL}(xi, ti)$ and is by definition the threshold voltage $V_{TH}i$ of the cell i located at xi. The threshold voltage $V_{TH}i$ is then simply given by evaluating the word line voltage function at (xi, ti). Thus $V_{TH}i=V_{WL}(xi, ti)$.

The time marker ti indicates a time local to the cell. In practice, if the cell's current is detected by a remote sense amplifier, a further delay to reach the sense amplifier must be taken into account. For example, in the arrangement shown in FIG. 5, the current is detected by a sense amplifier in a sense block 200 among the read/write circuits 130A and 130B at the peripheral of the memory array 100. The sense amplifier is coupled to the drain of the cell via a bit line. In operation, the sense amplifier can be made to sense periodically as timed by a sensing clock signal. For example, the sense strobe may be timed to repeat every microsecond. The bit line will exact a delay $\Delta T_{BL}(y)$ from the cell to the sense amplifier, where y is the length of the bit line. Thus, if the cell i is detected by the sense amplifier to start conducting at time t'ij then the local time marker ti can be derived by ti=t'ij−$\Delta T_{BL}(y)$, where t'ij is the detection time for the sense amp of the cell at (x, y). In one embodiment, the bit line access $\Delta T_{BL}(y)$ can be obtained by the same RC model as the word line delay. In another embodiment, the bit line access can be obtained by simulation. Since it is constant for a group of cell along the same word line or page, it can also be measured by a differential sensing technique in which the common delay between two sensing can be subtracted out.

Figure 13:
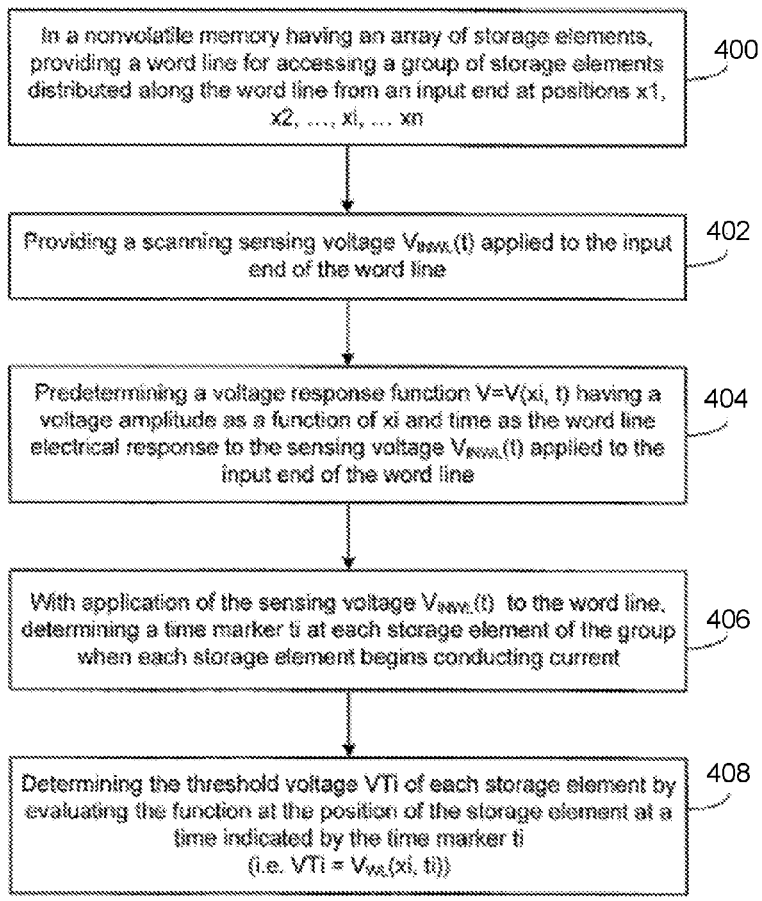
FIG. 13 is a flowchart describing a process of sensing by a continuous scanning in a time domain technique.

FIG. 13 is a flowchart illustrating sensing by a continuous scanning in a time domain technique. At step 400, in a nonvolatile memory having an array of storage elements, the process includes providing a word line for accessing a group of storage elements distributed along the word line from an input end at positions x1, x2, . . . , xi, . . . xn. At step 402, the process includes providing an input scanning sensing voltage $V_{INWL}(t)$ to the input end of the word line. At step 404, the process includes predetermining a word line response function $V_{WL}(xi, t)$ having a voltage amplitude as a function of xi and time as the word line electrical response to the input scanning sensing voltage $V_{INWL}(t)$ applied to the input end of the word line.

At step 406, with application of the sensing voltage $V_{INWL}(t)$ to the word line, the process includes determining a time marker ti at each storage element of the group when each storage element begins conducting current. At step 408, the process includes determining the threshold voltage VTi of each storage element by evaluating the word line response function at the position of the storage element at a time indicated by the time marker ti (i.e. VTi=$V_{WL}(xi, ti)$). In general the input scanning sensing voltage is one that is monotonically increasing as a function of time. As shown in FIG. 12 at (A), an input scanning sensing voltage is a linear function with a constant ramp rate.

In one embodiment, the input scanning voltage is a linear ramp voltage. In the process of FIG. 13, the input sensing voltage $V_{INWL}(t)$ has a predetermined constant ramp rate. In one embodiment, the sensing is by a continuous scanning technique in which the storage element's conduction is detected by a sense amplifier coupled via a bit line and the resultant delay is accounted for. As described above, the time marker is relative to the real time when the storage element i is turned on. In the case when the storage element's current is detected by a sense amplifier linked by a bit line, the detection time at the sense amplifier is delayed by the signal propagation from the storage element to the sense amplifier.

In one embodiment, determining the time marker for a storage element includes detecting the conduction current by a sense amplifier coupled to the storage element via a bit line, the time marker being the detection time at the sense amplifier offset by a predetermined delayed period. In one embodiment, evaluating the word line response function at (xi, ti) includes evaluating the input sensing voltage at after allowing for word line and bit line delays relative to the storage element at (xi, yi) in the memory array, with $V_{TH}i=V_{INWL}(tij-\Delta T_{WL}(xi)-\Delta T_{BL}(yi))$ where tij is the detection time for conduction at the sense amp and $\Delta T_{WL}(xi)$ and $\Delta T_{BL}(yi)$ are respectively delay in the word line and bit line relative to the storage element i.

In one embodiment, deriving the threshold of a storage element in the continuous scanning technique is provided as follows. As can be seen from FIG. 12 at (A) and (B), the input voltage $V_{INWL}(t)$ is applied to the word line and it is delayed by $\Delta T_{WL}(xi)$ at for storage element i at position xi down the word line. The delay can be calculated from the response function $V_{WL}(X, t)$. Thus, the voltage that develops on the word line at xi is simply given by the input voltage shifted by the delay in time, i.e., $V_{WL}(xi, t)=V_{INWL}(t-\Delta T_{WL}(xi))$. Similarly, the sense amp detects the event of the storage element's conduction delayed by the bit line at $t'=t+\Delta T_{BL}(y)$. Thus, the threshold at storage element i is given by the input voltage shifted in time by both the delays in the word line and the bit line, i.e., $V_{TH}i=V_{INWL}(t'')=V_{INWL}(t-\Delta T_{WL}(xi))=V_{INWL}(t'=\Delta T_{WL}(xi)=\Delta T_{BL}(y))$.

Accordingly, determining the threshold voltage VTi of each storage element can include evaluating the word line response function at the position of the storage element at a time indicated by the time marker ti can include evaluating the input voltage function at the detection time at the sense amplifier shifted in time by a predetermined word line delay and the predetermined bit line access (i.e. $VTi=V_{WL}(xi, ti)=V_{INWL}(t'-\Delta T_{WL}(xi)-\Delta T_{BL}(y))$).

The continuous scanning sensing technique can greatly improve sensing performance particular with respect to multi-level sensing. As explained earlier in connection with FIG. 11, prior multi-level sensing schemes have the word line and bit line delays compounding with each sense level. Thus the total sense time scales with the number of sense levels.

In one embodiment, the memory system may implement compensation as a function of the physical location across a word line. For example, ramp based sensing may have different accuracy across the word line due to the different timing required for the control gate voltage to propagate across the word line. Analog and/or digital compensation can be applied to alleviate the effects of this timing. Analog compensation may be done by controlling the bit line biasing voltage. For example, a different bit line precharge voltage may be used for cells that are closer to the word line driver versus cells that are far from the driver. Alternatively, digital compensation can be used in the controller. One example is digital adjustment of the read voltage value of a cell according to the location of the cell along the word line. Another example is adjustment of the soft ECC metric (e.g. the LLR) assigned to the bits read from the cell according to the location of the cell along the word line. For example, lower reliability may be assigned to cells that are far from the word line driver compared to cells that are close to the word line driver.

FIG. 14 depicts one example of data encoding in accordance with an embodiment. Three bits of data are depicted for each data state as an example, but any number of bits may be used. Each bit for each storage element is in the same logical page. The bottom bit in each memory cell is part of a first data bit set DB0, the middle bit is part of a second data bit set DB1, and the upper bit is part of a third data bit set DB2. Each data bit set includes one bit from each memory cell of a group of memory cells. The group of memory cells may be a row of memory cells coupled to a common word line or a subset of a row of memory cells.

Below is a table that also shows the data encoding for the threshold voltage distribution of FIG. 14.

|     | S0 | S1 | S2 | S3 | S4 | S5 | S6 | S7 |
| --- | --- | --- | --- | --- | --- | --- | --- | --- |
| DB2 | 1 | 1 | 1 | 0 | 0 | 0 | 0 | 1 |
| DB1 | 1 | 1 | 0 | 0 | 1 | 1 | 0 | 0 |
| DB0 | 1 | 0 | 0 | 0 | 0 | 1 | 1 | 1 |

FIG. 14 shows the seven read compare voltages Vr1, Vr2, Vr3, Vr4, Vr5, Vr6, and Vr7 discussed above with respect to FIG. 7. While in FIG. 7 the read compare voltages are between (but outside of) the threshold voltage distributions corresponding to the data states, in FIG. 14 the read compare voltages are within the overlap of two neighboring threshold voltage distributions corresponding to data states. As such, a read process that only tests whether the threshold voltages of the memory cells are less than or greater than the seven read compare voltages (e.g., hard bits) may not be accurate enough to correctly read the stored data. Therefore, one embodiment reads at a higher resolution than the user data encoding during each read operation to more accurately determine the user data for the group of memory cells. Moreover, the system programs and reads the data for each data bit set for each memory cell so that the data is encoded and decoded across the plurality of data bit sets associated with each memory cell.

In one embodiment, reading at the higher resolution comprises determining soft information relative to each memory cell. Soft information indicates higher resolution data with respect to the physical state a memory cell is intended to be programmed. The soft information may indicate, for example, a more precise level of a cell's threshold voltage than simply the physical state to which the cell is programmed as indicated by the hard data information exclusively. FIG. 14 depicts the use of soft information in one example. The system may sense soft information simultaneously with hard information using ramp sensing. The soft information may include one or more soft bits for each data state. The hard bits and the soft bits will be transferred from the memory chip to the controller. The controller uses the hard bits and soft bits as part of a LDPC decoding process to accurately determine the data being stored in the memory cells. In FIG. 14, two soft bit data sets SB0 and SB1. In addition to the hard bits representing the user data, the system may sense to determine for each storage element values for soft bits SB0 and SB1.

FIG. 14 shows a set of discrete soft bit compare voltages for example. Vr11 and Vr12 are soft bit compare voltages for one example of a soft bit associated with Vr1. The soft bit for a given memory cell indicates whether that given memory cell has its threshold voltage between Vr11 and Vr12. When reading a memory cell, if Vr1 is applied to the control gate and the memory cell conducts current, then the memory cell is likely to be in state S0. If Vr11 is applied to the control gate and the memory cell conducts, then the controller has a higher degree of confidence that the memory cell is in state S0. However, if the tests at Vr1 and Vr11 indicate that the threshold voltage of the memory cell is between Vr1 and Vr11, then the controller has a lower degree of confidence that the memory cell is in state S0. If the threshold voltages is greater than Vr12, then the controller can be more confident that the memory cell is not in state S0. If the threshold voltage for a memory cell is between Vr1 and Vr12, then the controller is less confident that the memory cell is not in state S0. This information can be used by the controller as part of various ECC techniques. In one example, the information is used in an LDPC decoding processes, but other codes can be used as well. In one embodiment, for each read compare voltage (e.g., Vr1, Vr2, ...) the memory chip will send to the controller a hard bit and one or more soft bits to be used as part of the LDPC decoding processes.

FIG. 14 also shows soft bit compare voltages for the other read compare voltages, which are used in the same way as discussed above with respect to Vr11 and Vr12. For example, Vr21 and Vr22 are soft bit compare voltages for one example of a soft bit associated with Vr2. The soft bit for a given memory cell indicates whether that given memory cell has its threshold voltage between Vr21 and Vr22. Vr31 and Vr32 are soft bit compare voltages for one example of a soft bit associated with Vr3. The soft bit for a given memory cell indicates whether that given memory cell has its threshold voltage between Vr31 and Vr32. Vr41 and Vr42 are soft bit compare voltages for one example of a soft bit associated with Vr4. The soft bit for a given memory cell indicates whether that given memory cell has its threshold voltage between Vr41 and Vr42. Vr51 and Vr52 are soft bit compare voltages for one example of a soft bit associated with Vr5. The soft bit for a given memory cell indicates whether that given memory cell has its threshold voltage between Vr51 and Vr52. Vr61 and Vr62 are soft bit compare voltages for one example of a soft bit associated with Vr6. The soft bit for a given memory cell indicates whether that given memory cell has its threshold voltage between Vr61 and Vr62. Vr71 and Vr72 are soft bit compare voltages for one example of a soft bit associated with Vr7. The soft bit for a given memory cell indicates whether that given memory cell has its threshold voltage between Vr71 and Vr72.

FIG. 14 depicts an example using actual hard bits and soft bits for transfer to the controller from the memory. In one embodiment, the memory system sends an index indicating the actual threshold voltage of the memory cell as determined by sensing across a range of read reference levels. The index can indicate a level of programming of each memory cell. In one embodiment, the index is the value of the DAC that supplies the input scanning sense voltage when a memory cell begins to conduct. Thus, the value can be provided at the bit resolution of the DAC. The index will thus indicate an actual threshold voltage or potential range of threshold voltages for the memory cell.

Because ramp sensing is used, the index may indicate at an even higher resolution than that indicated in FIG. 14. Theoretically, any resolution may be used dependent only on the resolution provided by the chosen DAC. In FIG. 14, the index might indicate with respect to the twenty-one discrete reference levels at which one a memory cell began to conduct. Thus, five bits of information may be used to transfer this information even though only eight data states are used (3 user data bits). If additional compare points are provided, additional bits may be transferred to indicate the threshold voltage with a finer granularity. In one example, 64 or more sense points may be selected in a single sense ramp and the DAC control setting can be captured based on whether the bit line is discharged or not at the corresponding sense point.

In one embodiment, the controller implements aggressive adaptive trimming of the voltage window. The controller may start with a minimum voltage window using lower verify levels for each of the programmed states. The controller may use a voltage window that provides a six-sigma bit error rate that is within the ECC capability when the memory is fresh (has not undergone write/erase cycling). The voltage window can be increased as the memory is cycled in order to maintain the six-sigma BER within the ECC capability. Other threshold levels can be used. In these examples, endurance can be increased at the expense of a higher bit error rate in early life conditions. The soft information enabled by ramp sensing may allow the controller to compensate for the higher BER while maintaining an acceptable throughput.

In one embodiment, the memory system provides interleaved encoding of user data over all of the hard data bits associated with a memory cell. FIG. 15 is a block diagram showing a traditional non-interleaved encoding scheme using a three-bit per cell example. FIG. 15 illustrates the logical page separation for a row of memory cells connected to one word line. Each memory cell stores one bit of data for an upper page, one bit of data for a middle page, and one bit of data for a lower page. As earlier described, the upper page, middle page, and lower page are programmed separately. Accordingly, the memory programs the different bits for each memory cell in different operations.

FIG. 15 further illustrates an example of the ECC sectors employed when memory cells store bits for more than one logical page. The upper page bits for a first subset of memory cells of the word line form a first error correction code (ECC) sector ECC1, the middle page bits for the first subset form a second ECC sector ECC2, and the lower page bits for the first subset form a third ECC sector ECC3. The upper page bits for a second subset of memory cells of the word line form a fourth ECC sector ECC4, the middle page bits for the second subset form a fifth ECC sector ECC5, and the lower page bits for the second subset form a sixth ECC sector ECC6. Similar divisions are made for a third and fourth subset of memory cells.

The ECC sectors correspond to error correction controls applied across a group of data in one embodiment. For example, the system may generate ECC codes and apply ECC controls across the upper page bits for the first subset of memory cells. The memory system applies these controls individually for each ECC sector. Accordingly, the error correction is applied at the bit level for sectors as is the encoding across different pages. In this manner, each memory cell is part of three different logical pages and three different ECC sectors. As such, the system may address bit error rates through encoding and error correction controls, but does not operate at the cell level across all of the bits for a memory cell together.

FIG. 16 illustrates a coding and error correction control scheme in accordance with one embodiment where interleaved coding is used. The controller encodes the user data for a word line using a single logical page that contains multiple bits for the logical page. In this manner, the user data is interleaved across all of the data bit sets for a word line. The coding for a row of memory cells coupled to one word line is again depicted. The row is not divided into multiple logical pages as in FIG. 15. Instead, each memory cell stores three bits for one logical page. In this example, a logical page is made up of three data bit sets. One logical page includes all of the data bits from each memory cell in data bit sets DB0, DB1, and DB2. In this example, a logical page will be three times the size as a logical page in FIG. 15.

In one embodiment, subsets of memory cells can be divided along a word line to form logical pages of equal size to those in FIG. 15.

FIG. 16 further depicts the ECC sectors. Each ECC sector is spread across all of the data bit sets for the memory cells. Each ECC sector includes all of the bits from a subset of memory cells across the word line. For example, ECC sector ECC1 includes for a first subset of memory cells a data bit from each of sets DB0, DB1, and DB2. In this particular example, each ECC sector in FIG. 14 is the same size as an ECC sector in FIG. 15. However, the ECC sector will include smaller subsets of memory cells since the sector includes three bits per cell instead of just one bit per cell.

Similar to the logical page division, the ECC sectors can thus be computed across all of the data bits for subsets of memory cells. For example, the system may generate ECC codes and apply ECC controls across the all of the data bits for the first subset of memory cells in ECC sector ECC1. The memory system applies these controls individually for each ECC sector. Accordingly, the error correction is applied at the cell level for sectors as the encoding across all data bits sets for one logical page including all of the bits from the memory cells. In this manner, each memory cell is part of one logical page and one ECC sector. As such, the system may address cell error rates through encoding and error correction controls by operating at the cell level across all of the bits for a memory cell together.

In one embodiment, interleaved encoding across all of the data bit sets for a subset of memory cells provides an error that is governed by the average cell error rate. In contrast with non-interleaved encodings that encode across bits of a cell separately, interleaved encoding can produce an error governed by the average bit error rate across all data bit sets, rather than the worst page bit error rate. Interleaved encoding is enabled by ramp-based sensing in one example, whereby all three data bit sets for a word line are provided in a single sequence. Interleaved coding further provides higher endurance. A higher correction capability is provided while transferring less data. The additional bits provided by the soft information can be provided with little to no penalty on performance as a single ramp sensing is applied rather than multiple discrete sensing periods at stepped read voltages.

Figure 18:
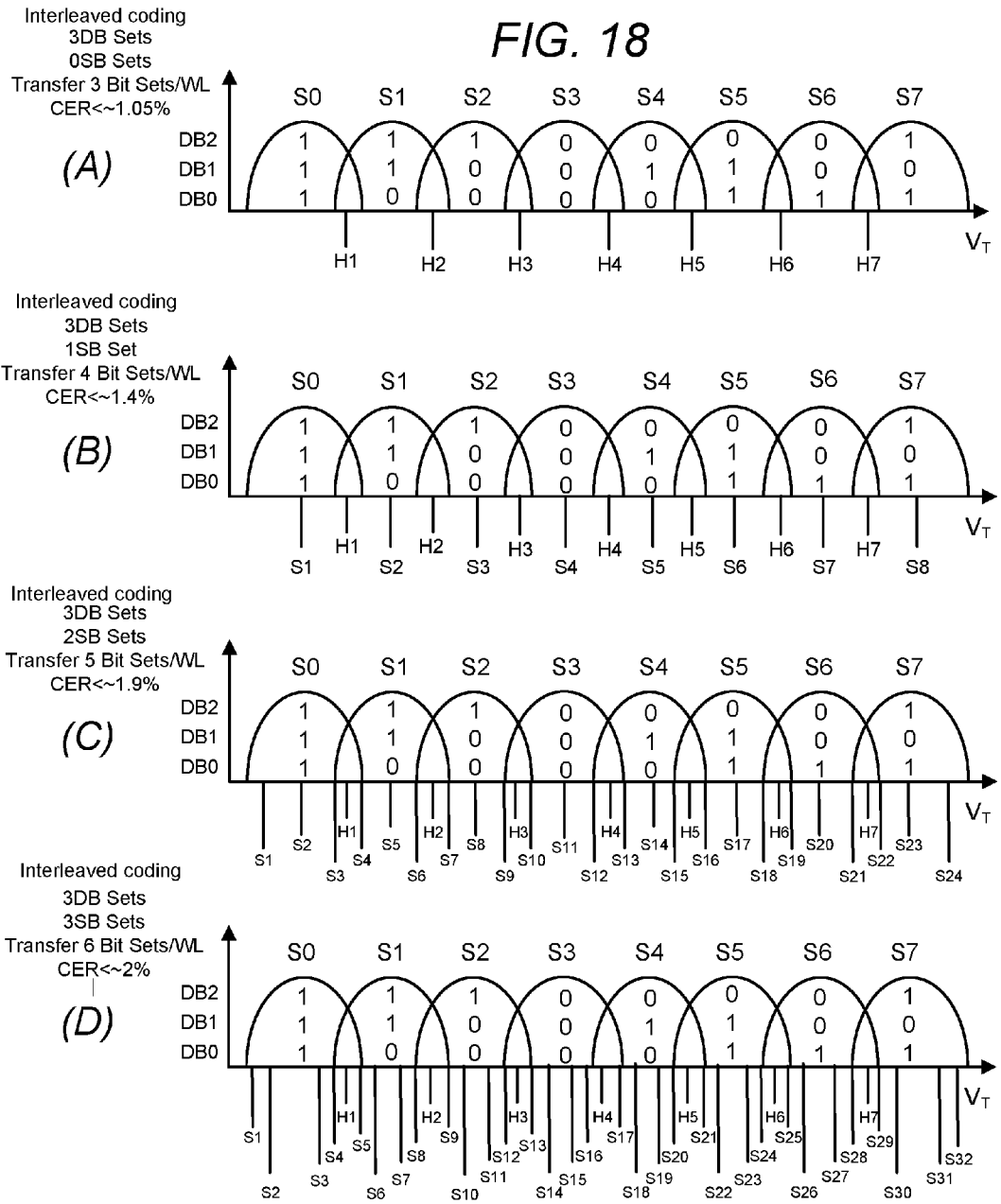
FIG. 18 depicts graphs of examples of a distribution of threshold voltages for a population of memory cells, each storing three bits of data using interleaved coding.

FIGS. 17 and 18 depict the state distributions for a group of charge storage elements plotting the number of storage elements as a function of threshold voltage. FIG. 17 depicts the state distributions for a group of memory cells storing user data that is encoded in the storage elements separately by logical page. In FIG. 17, each storage element stores one bit from a lower page of data, one bit from a middle page of data, and one bit from an upper page of data. The controller and memory organize the user data according to logical page. The controller encodes user data separately for the different logical pages. This results in each memory cell storing three bits of data that have each been encoded separately and for different logical pages.

FIG. 17 at (A) depicts the details of determining the physical state to which each storage element is programmed when non-interleaved encoding is used and the storage elements store three bits. Seven read reference levels are used to determine the data bits in each storage element. The read reference levels to discriminate the eight physical states are denoted H1 to H7 for simplicity. These read reference levels correspond to the hard bit read reference voltages Vr1, Vr2, etc. as described with respects to FIGS. 7 and 14. In the non-interleaved coding depicted, reference levels H1 and H5 are associated with the lower page, reference levels H2, H4, and H6 are associated with the middle page, and reference levels H3 and H7 are associated with the upper page. The state machine determines the lower page data bit for each storage element by determining whether the threshold voltage of the storage element is above or below each of reference levels H1 and H5. The state machine determines the middle page data bit for each storage element by determining whether the threshold voltage of the storage element is above or below each of reference levels H2, H4, and H6. The state machine determines the middle page data bit for each storage element by determining whether the threshold voltage of the storage element is above or below each of reference levels H3 and H7. Each determination is performed separately. Accordingly, the error rate associated with the encoding is generally controlled by the worst page. The errors are not spread across multiple bits of the storage elements. In one specific example, the worst page bit error rate for such a system may be approximately 0.7%.

FIG. 17 at (B) continues with the example of FIG. 17 at (A), showing the effects of soft bit decoding. In FIG. 17 at (B), the state machine senses at fourteen additional read reference levels referred to as soft bit reference levels S1-S14. Sensing at levels S1-S14 is used to determine one soft bit of information for the memory cells of the word line. In this case, the state machine compares the threshold voltage of each storage element to an additional fourteen reference levels to determine with finer granularity the threshold voltage of each storage element. In this case, soft bit reference levels 51, S2, S9, and S10 are associated with the lower page, soft bit reference levels S3, S4, S7, S8, S11, and S12 are associated with the middle page, and soft bit reference levels S5, S6, S13, and S14 are associated with the upper page. As with the hard bit information, the system senses the soft bit information separately for each page and transfers the information separately to the controller. In one specific example, the worst page bit error rate for such a system may be approximately 1.6%.

FIG. 17 at (C) shows an example where 28 soft bit reference levels are used. In this case, soft bit reference levels S1-S4 and S17-S20 are associated with the lower page, soft bit reference levels S5-S8, S13-S16, and S21-S24 are associated with the middle page, and soft bit reference levels S9-S12 and S25-S28 are associated with the upper page. In one specific example, the worst page bit error rate for such a system may be approximately 1.8%.

FIG. 18 depicts the state distributions according to one embodiment using interleaved coding for a set of charge storage elements coupled to a word line. In FIG. 18, each storage element stores three bits of data from a single logical page. Each bit may be associated with a different data bit set. For example, FIG. 18 shows data bit sets DB0, DB1, and DB2. The controller encodes the user data using interleaved coding across all of the data bits for the storage elements. Thus, each storage element stores three bits of data coded for a single logical page.

FIG. 18 at (A) depicts the details of determining the physical state to which each storage element is programmed when interleaved encoding is used and the storage elements store three data bits. As with FIG. 17 at (A), seven read reference levels H1-H7 are used to determine the data bits in each storage element. These data bits encoded with the user data may be referred to as hard data bits. Using the interleaved coding depicted, the reference levels are all associated with one logical page. Accordingly, the system applies each of the read reference levels H1-H7 to determine all three data bits for each storage element during each sense operation. Separate logical page readings at subsets of the read reference levels are not used. In one example, the system uses ramp-based sensing to determine the threshold voltage of the storage elements using a continuous scanning sense voltage that spans levels H1-H7. It is noted, however, that the state machine may determine an index value representing the threshold voltage of each storage element which is transferred to the controller at any chosen bit-level granularity. Because the controller receives hard information relating to each of the data bits for each storage element, the bit error rate is controlled by the average bit error rate across each of the data bit sets. In this example, using interleaved encoding alone without soft information may provide an average bit error rate of about or less than 1.05% in one specific example.

FIG. 18 at (B) continues with the example of FIG. 18 at (A), showing the effects of soft bit decoding. In FIG. 18 at (B), the state machine senses at eight additional read reference levels referred to as soft bit reference levels S1-S8. Sensing at levels S1-S8 is used to determine one soft bit of information for the memory cells of the word line. In this case, state machine 122 compares the threshold voltage of each storage element to an additional eight reference levels to determine with finer granularity the threshold voltage of each storage element. The system senses the soft bit information simultaneously with the hard bit information using ramp sensing. Accordingly, although eight soft bit reference levels are shown, any number of reference points may be used to generate an index value representing the threshold voltage of each storage element in one example. In FIG. 18B, the soft information is transferred with the hard bit information to the controller. The soft information can be transferred as a soft bit data set in one example. Because the controller receives hard information relating to each of the data bits simultaneously with the soft bit information for each storage element, the average bit error rate may be about or less than 1.4% in one specific example.

In FIG. 18 at (C), the state machine senses at 24 soft bit reference levels. Sensing at levels S1-S24 is used to determine two soft bits of information for the memory cells of the word line. In this case, the state machine compares the threshold voltage of each storage element to an additional 24 reference levels to determine with even finer granularity the threshold voltage of each storage element. The soft information from sensing as shown in FIG. 18C can be transferred as two soft bit data sets in one example. The average bit error rate may be about or less than 1.9% in one specific example using interleaved coding as shown in FIG. 18 at (C) with 24 soft bit compare points.

In FIG. 18 at (D), the state machine senses at 32 soft bit reference levels S1-S32. The soft information from sensing as shown in FIG. 18 at (D) can be transferred as three soft bit data sets in one example. The average bit error rate may be about or less than 2% in one specific example using interleaved coding as shown in FIG. 16 with 32 soft bit compare points.

Interleaved coding permits neighboring bit line equalizations to compensate for cross-coupling between cells. When data is encoded for a word line, the data for each bit line neighboring cell is known. The data can be read from the memory. Because the neighboring data is not divided into logical pages within one cell, all of the cell data can be read and used to provide equalizations when programming the selected word line. In previous memories with logical page divisions within a cell, only a single page could be read so that only partial equalizations could be obtained.

Figures 19, 20, 21:
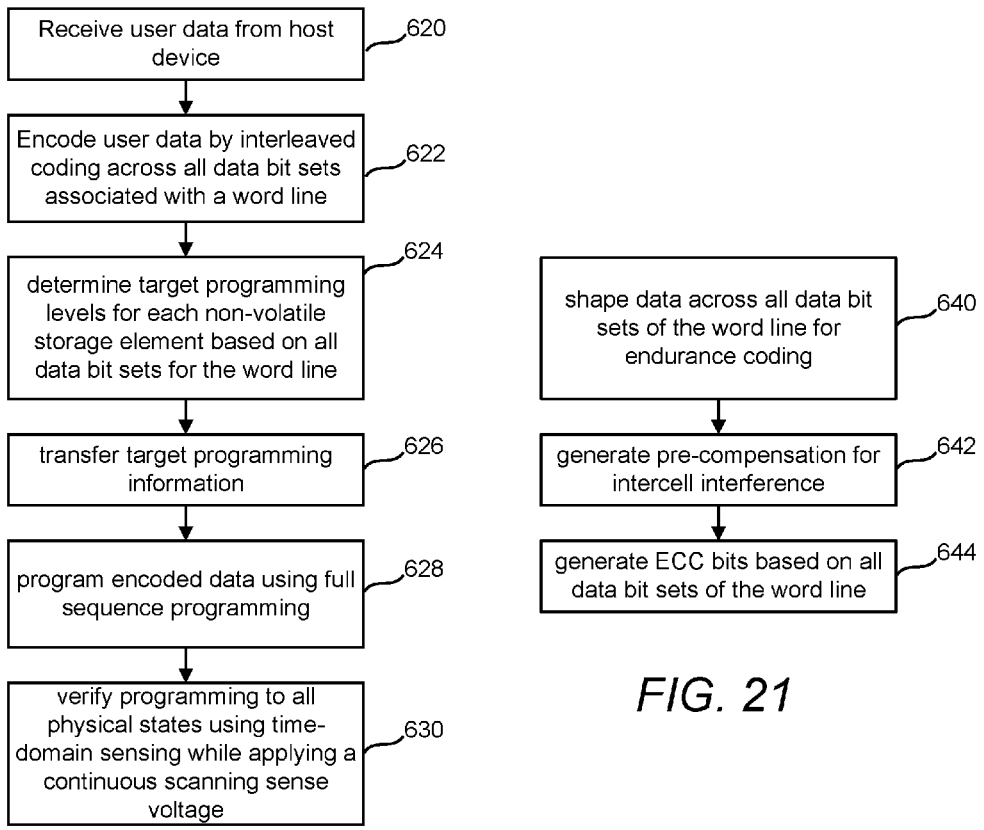
FIG. 19 is a graph depicting an example of a distribution of threshold voltages for a population of memory cells that has been shaped for a monotonically decreasing state probability.
FIG. 20 is a flowchart describing a process of programming and verifying non-volatile memory use ramp sensing verification according to one embodiment.
FIG. 21 is a flowchart describing a process of encoding user data according to one embodiment.

FIG. 19 describes one example of data shaping that can be applied when interleaved coding across all data bit sets is used. In FIG. 19, the state probabilities for a 3-bit per cell system storing data in eight data states is shown. When programming a selected word line, the controller can shape the user data over all the data bit sets for the word line. In this manner, the data can be shaped for all of the data bits for each memory cell. This may be contrasted with previous techniques where data was only shaped over a logical page including one bit per cell. In FIG. 19, the shaping can be used to generate state probabilities that are monotonically decreasing from the erased state to the highest threshold voltage level programmed state. In this manner, the number of cells programmed to the highest level can be decreased when compared with the other physical states. This can improve the endurance of the memory by decreasing the number of cells that may undergo full programming to the highest physical level.

FIG. 20 is a flowchart describing a process of programming user data according to one embodiment. FIG. 20 provides more details of the process of FIG. 8 at the system level. At step 620, the controller receives user data for programming to the non-volatile memory array. The user data may be received from a host device as part of a read request. In another example, the user data may be read from the memory array as part of a process of rewriting data or for other reasons.

At step 622, the controller encodes the user data for programming. Specifically, the controller uses interleaved coding to distribute the user data across all of the data bits for memory cells. The controller may select a word line for storing the user data. The controller encodes the data across all of the data bit sets associated with the word line. For example, the controller may encode the user data over three data bit sets associated with a 3-bit per cell memory in one example. Step 622 may include encoding data for a single logical page that includes multiple bits from each memory cell associated with the logical page. Step 622 may include various operations such as scrambling data, shaping data, applying intercell interference compensations, and calculating ECC information for the data.

At step 624, the memory system optionally determines target programming levels for the target memory cells. In one embodiment, the controller passes the encoded data to the memory system without calculating target programming levels. Step 624, however, can include determining additional information beyond target state information that is passed to the memory from the controller for programming the user data. For example, step 624 may include determining target programming levels for memory cells based on previously programmed neighboring memory cells or to-be-programmed neighboring memory cells. The controller can read information from the neighboring already programmed cells prior to programming the target memory cells. This information can be used to adjust the target programming levels for each memory cell to compensate for intercell interference. If a target memory cell is adjacent to a memory cell that is programmed to a higher level state, the charge coupling from the neighboring cell may raise the apparent threshold voltage of the target memory cell. Similarly, programming the target memory cell may raise the apparent threshold voltage of the neighboring memory cell. If a cell is to be programmed subsequently to the target memory cell, such programming may raise the apparent threshold voltage of the target memory cell. The controller may compute a lower target programming level for the target memory cell because its threshold voltage may appear to rise after programming or in an effort to reduce the charge coupling from the target memory cell to an adjacent memory cell. Other types of compensations may be applied at step 624.

At step 626, the target programming information is transferred from the controller to the memory. As a result of the encoding and intercell interference cancellations, the target programming information may include more data bits for each memory cell than the original user data. The intercell interference compensation may alter target programming voltages from their original values. Thus, the number of bits for programming a memory cell may include more bits than are actually encoded user data bits for the cell. For example, three user data bits may be transferred to the memory for each memory cell along with two precompensation bits in one example. Bit packing is used in one example so that the user data bits and precompensation bits are contained in a single page of symbols aligned to each memory cell. The target programming information may comprise a page of data in one example, where the page includes multiple bits from the memory cells.

At step 628, the encoded data is programmed using full sequence programming. Step 628 can include using target programming levels transferred from the controller in one example. In another example, the state machine determines target programming levels based on encoded user data and precompensation bits. Because the user data is encoded across all of the data bit sets associated with the memory cells, full sequence programming is used to program all data bits for the memory cells simultaneously. Moreover, memory cells are programmed to each of the programmable states simultaneously.

At step 630, the state machine verifies programming of the target memory cells to all of the physical states. The state machine applies an input scanning sense voltage that sweeps through all of the target programming levels. In this manner, any number of target programming levels can be used for the target group of memory cells without undue impacts on programming performance.

FIG. 21 is a flowchart describing a process of encoding user data according to one embodiment. FIG. 21 provides additional details of the process of encoding at step 622 of FIG. 20 in one example. At step 640, the controller shapes the data across all of the data bit sets for a selected word line. Step 640 can include shaping the data for endurance coding in one example. In many cases, data stored in storage subsystems can have fixed patterns of data that can be intended for storage in adjacent physical pages. In certain cases, this can result in data that is stored in a group of cells associated with the same bit line in a block to have a data pattern that increases likelihood of deleterious program effects (e.g. data pattern dependent program disturb. By applying a data scramble that varies from page to page at step 640, such circumstances can be avoided. Data can also be encoded at step 640 to compensate for coupling effects between physically proximate charge storage elements. The encoding can transform data to minimize the number of adjacent cells along the wordline that have significantly different threshold voltages.

At step 642, the controller generates pre-compensation for intercell interference. Based on the programming levels of previously programmed neighbor memory cells to the target memory cells, precompensations can be applied to the data set to minimize coupling between adjacent pages. Precompensations for equalization can be done without additional read operations. Precompensations can be determined in one example based on charge storage elements from adjacent bit lines. The state data may be available for these neighbors without additional read operations.

At step 644, the controller generates ECC information for the data set to be programmed. The ECC information is generated in one embodiment for a logical page that includes multiple bits from each memory cell of a word line. In this manner, the ECC information is calculated at the cell level rather than at a logical page level that only includes a subset of the bits for a charge storage element.

Figure 22:
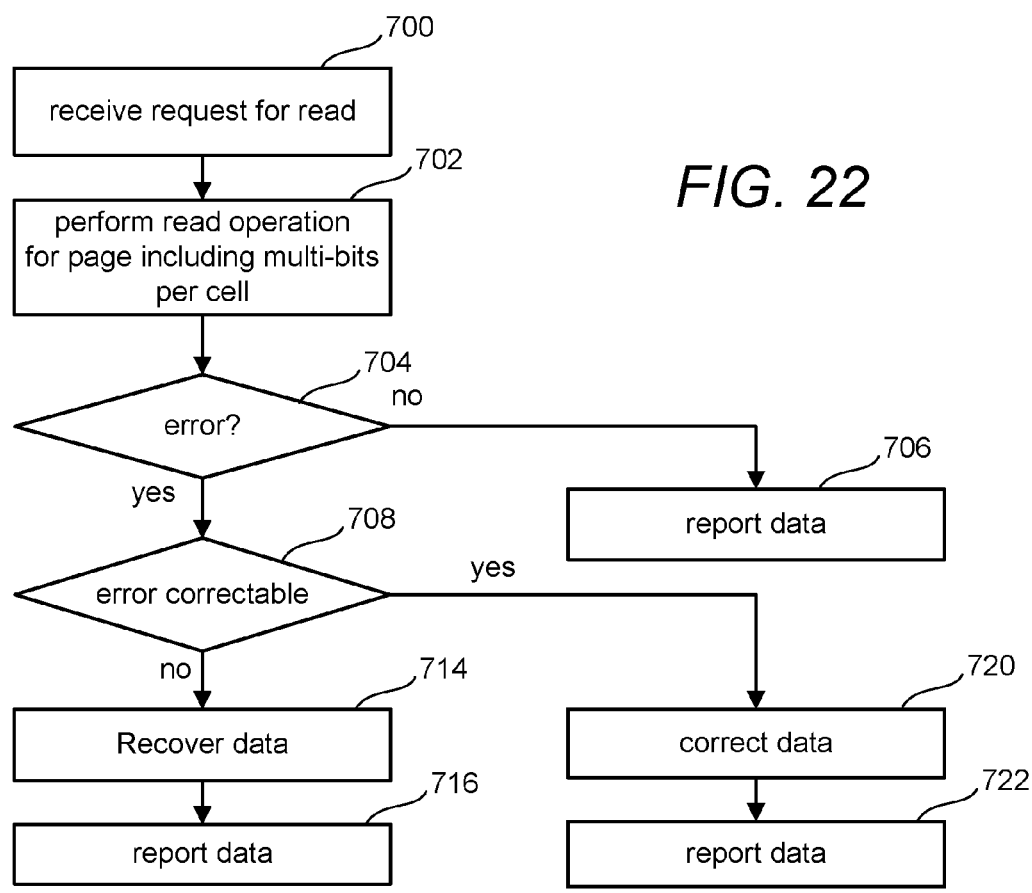
FIG. 22 is a flowchart describing a process of reading non-volatile memory according to one embodiment.

FIG. 22 is a flow chart describing one embodiment for reading data from non-volatile memory cells. FIG. 22 provides the read process at the system level. At step 700, a request to read data is received. At step 702, a read operation is performed for a particular page in response to the request to read data. The page at step 702 includes multiple data bits for each cell, representing an interleaved coding. Accordingly, the memory reads each of the bits from the storage elements at step 702. Additionally, the read operation at step 702 may include determining soft information in addition to the hard bits for each memory cell. For example, the controller may receive an index value representing the memory cell's threshold voltage. In another example, the controller may receive hard bits representing the physical state of the storage element and soft data bits as earlier described.

In one embodiment, when data for a page is programmed, the system will also create extra bits used for Error Correction Codes (ECCs) and write those ECC bits along with the page of data. When reading data from a page, the ECC bits will be used to determine whether there are any errors in the data at step 704. The ECC process can be performed by the controller, the state machine or elsewhere in the system. If there are no errors in the data, the data is reported to the user at step 706. If an error is found at step 704, it is determined whether the error is correctable at step 708. The error may be due to floating gate to floating gate coupling or other reasons. Various ECC methods have the ability to correct a predetermined number of errors in a set of data. If the ECC process can correct the data, then the ECC process is used to correct that data at step 710 and the data, as corrected, is reported to the user at step 712. If the data is not correctable by the ECC process, a data recovery process may be performed at step 714. In some embodiments, an ECC process will be performed after step 714. After the data is recovered, that data is reported to the host at step 716. The process can continue by reading additional pages if necessary while reporting data to the host.

Figure 23:
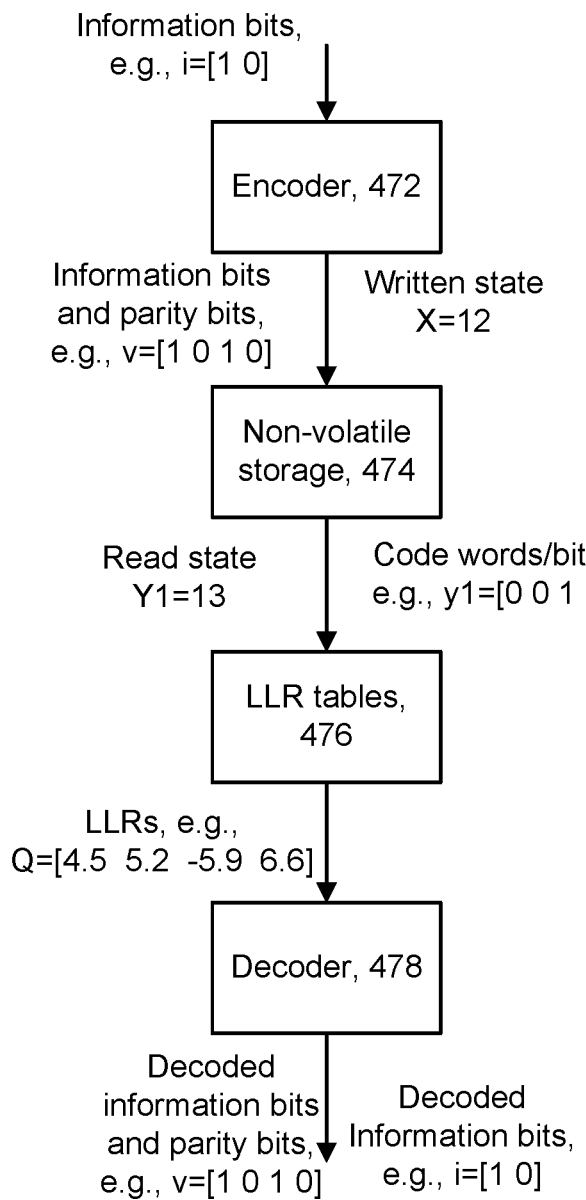
FIG. 23 is a block diagram of an error correction control system in accordance with one embodiment.

FIG. 23 depicts a system for encoding and decoding data for non-volatile storage that can be used in accordance with one embodiment. Error correction controls are employed to detect and correct readings of erroneous or corrupted data in the non-volatile memory array. Generally speaking, some additional ECC or parity bits are calculated from the input data and stored in the memory array according to an encoding scheme. When reading, the input data and ECC bits are both read, and a decoder uses both to detect whether errors are present and in some cases, in which bit(s) the errors occur.

The error correction control system of FIG. 23 can be implemented as part of controller 144 in one embodiment, although different systems and architectures can be used. The system of FIG. 23 includes an encoder 472, memory array 474, LLR (logarithmic likelihood ratio) tables 476 and a decoder 478. The encoder 472 receives user data, also referred to as information bits, that is to be stored in memory array 474. The informational bits are represented by the matrix i=[1 0]. The encoder 402 implements an error correction coding process in which parity bits are added to the informational bits to provide data represented by the matrix or code word v=[1 0 1 0], indicating that two parity bits have been appended to the data bits. Other techniques, such as those discussed hereinafter, can be used that map input data to output data in more complex manners. Low density parity check (LDPC) codes, also referred to as Gallager codes, can be used. In practice, such codes are typically applied to multiple pages encoded across a number of storage elements. The data bits can then be mapped to a logical page and stored in the non-volatile storage 474 by programming a non-volatile storage element to a programming state, e.g., X=12, which corresponds to v. With a four-bit data matrix v, sixteen programming states can be used. Generally, parity bits are not used for each individual cell.

In one possible implementation, an iterative probabilistic decoding process is used which implements error correction decoding corresponding to the encoding implemented at the encoder 472. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables 476. LLR values are measures of the reliability with which the values of various binary bits read from the storage elements are known.

The LLR for a bit is given by $Q=\log_2 P(v=0|Y)/P(v=1|Y)$, where $P(v=0|Y)$ is the probability that a bit is a 0 given the condition that the read state is Y, and $P(v=1|Y)$ is the probability that a bit is a 1 given the condition that the read state is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the four bit positions in the codeword y1. For example, LLRs of 4.5, 5.2, −5.9 and 6.6 are assigned to bits 0, 0, 1 and 0, respectively, of y1. Further, the LLR tables can account for the multiple read results so that an LLR of greater magnitude is used when the bit value is consistent in the different code words.

The decoder 478 receives the code word y1 and the LLRs. The decoder 478 iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of y1 is completed to obtain the decoded information including parity bits v and the decoded information bits i.

Figure 24:
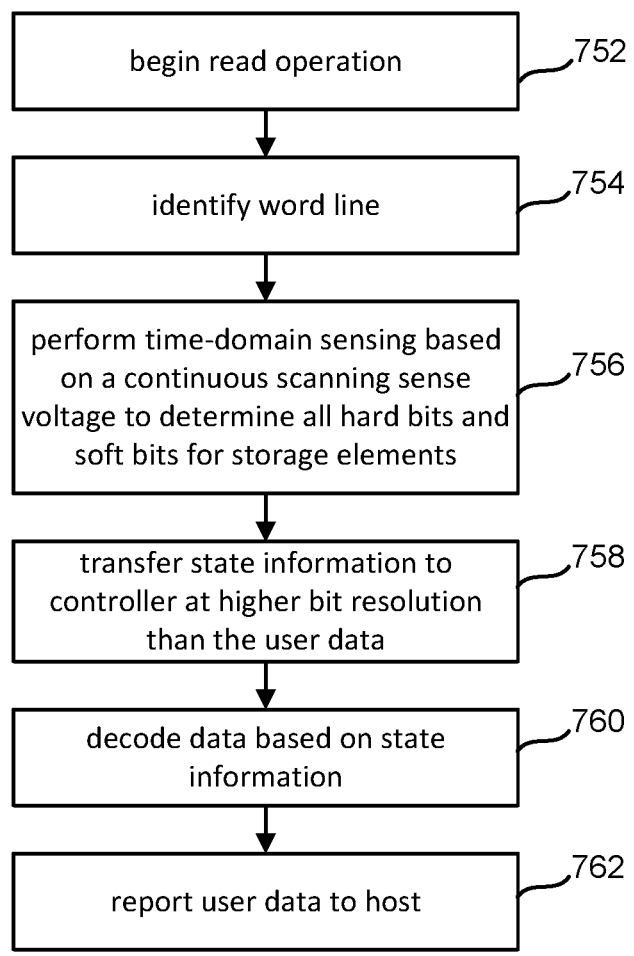
FIG. 24 is a flowchart describing a process of reading non-volatile memory according to one embodiment.

FIG. 24 is a flowchart describing a process of reading from a non-volatile memory according to one embodiment. FIG. 24 describes reading at the system level. The process of FIG. 24 can be used to perform an initial decode for user data, for example at step 702 of FIG. 22. The process of FIG. 24 may also performed as part of recovering data at step 714 and correcting data at step 710.

The read operation begins at step 752. The read operation may be performed in response to a request from a host device or for other reasons. Read operations may also be performed as part of a compensation process for reading other storage elements or to enable a rewrite of previously written data. After the read operation begins, the controller identifies at least one word line at step 754 to determine the user data for the read operation. After identifying a word line, the controller initiates time-domain sensing at the memory at step 756. The control circuitry for the memory chip receives the request for user data and senses state information for each storage element of the word line at step 756. The state machine applies an input scanning sense voltage than spans or sweeps a range of read reference levels corresponding to programming levels for the storage elements. The sense voltage is applied using a DAC in one embodiment. The DAC for the word line includes a control register that sets the Vread value. The DAC increments through the control register values to generate the sense voltage. The data registers for each bit line are set to the controlling value of the DAC when the corresponding memory cell conducts and discharges the bit line.

At step 758, the state machine transfer state information to the controller. The state information includes a higher bit resolution than the originally encoded user data. For example, the state machine may transfer an index for each memory cell containing the DAC setting stored in the data registers for the storage element's bit line. Thus, the state information may not directly represent data bits. Instead, the state information may include the DAC setting information as a true analog value for post processing by the controller. The value of the DAC control can be used as the index to represent the analog threshold voltage of the cell or multiple hard data bits and soft data bits associated with the cell. The DAC setting or index can be transmitted from the memory to the controller for each memory cell.

In one embodiment, the state machine will compress the data such as the index values or hard and soft bit information before transfer to the controller. Ramp sensing allows for fast sensing with a high resolution determination of a storage element's threshold voltage, including multiple soft bits for example. To accelerate the transfer of this information to the controller from the memory chip, compression may be used on the high resolution result. It can be observed that that not all the threshold values are equally likely. A threshold voltage value in the main lobes of a cell voltage distribution is much more likely than a threshold voltage value in the transition points in between the lobes. This means that the page of threshold voltage values likely does not have full entropy (i.e. each of its entries does not have a uniform distribution across all the possible threshold voltage values). Hence the data may often be highly compressible. Compression can be done using different methods, for example RLE or Huffman coding can be used. It can be done on the threshold voltage level, e.g. by building a Huffman code based on the probability of each threshold value. Alternatively it can be done on the soft bit set level, i.e. to compress the soft bit sets which may have many more 1's than 0's.

At step 760, the controller decodes the user data using the state information from the state machine for each storage element. The controller initiates post processing to transform the state information into data bits. Decoding the user data at step 760 can include applying pre-read compensation, soft decoding, intercell interference cancellation, and data unscrambling processes.

Pre-reading compensations may use known characteristics of the addresses group of cells including write/erase cycle count, temperate, and data retention characteristics. Decoding may include application of the ECC as read with the addresses storage elements. The values input to the ECC engine and decoder may be modified to compensate for cell specific contributions to variability in read data relative to the originally programmed voltage of the storage element. The values input to the ECC may also be modified based on the programming levels of storage elements in pages neighboring the selected page, for example on an adjacent word line. By modifying the values, the iterations required in decoding by the ECC engine or soft decoding engine may be reduced.

As earlier described, the index or other state information received for each storage element contains more information such as more bits than the originally programmed user data bits. These additional bits provide soft information that improves the values of the maximum likelihood values used in soft decoding processes. Because these additional soft bits are processed as an entire group with the user data (hard bits) for the entire addressed page, the matrix of LLR values provides a better basis for soft decision making in the soft decoding process, thus enhancing error rate performance.

Intercell interference compensation can be performed after ECC in order to decode the original data programmed into the storage elements after the encoding that was applied to avoid large differences stored charges to reduce coupling effects. Data unscrambling can be performed if required to reverse scrambling transformations during the encoding process.

The memory system may use multiple read trials in order to optimize the achievable performance with ramp based sensing in one example. Multiple read modes may be provided that have different timing parameters. A fast read based on aggressive timing parameters can be used initially (e.g. fast ramp sense voltage). In many cases this read may be sufficient, as the average bit error rates during the life time of memories are usually very low and only at end of life conditions (e.g. old memory or data) the error rates increase and a full ECC capability is required. Hence, even if the aggressive timing read increases the error rates, typically they will be below the ECC capability of the system. In the rare events when ECC fails during the first read attempt, a second read attempt may be triggered with relaxed timing parameters (e.g. slow ramp), inducing lower error rates.

Accordingly, a non-volatile storage device is provided in accordance with one embodiment that includes a non-volatile memory including a plurality of non-volatile storage elements configured to store a plurality of hard bits using a plurality of physical states. The device includes a plurality of word lines coupled to the plurality of non-volatile storage elements where each word line is associated with a plurality of bit sets including two or more hard bit sets and one or more soft bit sets. The device includes a controller in communication with the non-volatile memory array that is configured to encode user data from a host device by interleaved coding across all of the hard bit sets associated with a selected word line and shape the user data over all of the physical states. The device includes one or more read/ write circuits configured to apply time-domain sensing to determine a threshold voltage of each non-volatile storage element of the selected word line using a single scanning sense voltage in response to a read request. The controller receives in response to each read request a plurality of hard bits and one or more soft bits for each non-volatile storage element of the selected word line in a single sequence.

A method of reading non-volatile storage element is provided in accordance with one embodiment that includes selecting a word line associated with a read operation where the word line is in communication with a group of non-volatile storage elements that are programmable to a plurality of physical states. The method includes applying to the word line a scanning sense voltage signal that spans a range of read reference levels for the plurality of physical states, determining a threshold voltage of each non-volatile storage element based on time-domain sensing while applying the scanning sense voltage signal, and determining state information for each non-volatile storage element based on the threshold voltage from the time-domain sensing. The state information exceeds a number of encoded bits in each non-volatile storage element. The method includes transferring from the non-volatile memory the state information for each storage element and performing an initial decode to determine data for the plurality of storage elements based on the state information for each non-volatile storage element.

A method of reading non-volatile storage element is provided in accordance with one embodiment that includes identifying a word line of a non-volatile memory for storage of data from a host device. The word line is associated with a plurality of data bit sets and is in communication with a group of non-volatile storage elements. The method includes encoding the data by interleaved coding over the plurality of data bit sets of the word line, determining a plurality of target programming levels for the group of non-volatile storage elements based on the encoded data for the plurality of data bit sets, programming the group of storage elements by full sequence programming to a plurality of physical states based on a target programming level for each non-volatile storage element, and verifying programming of the plurality of storage elements to all of the physical states using time-domain sensing while applying a scanning sense voltage signal to the word line.

A method of reading non-volatile storage element is provided in accordance with one embodiment that includes selecting by a controller in communication with a non-volatile memory a word line corresponding to a read request. The word line is in communication with a group of non-volatile storage elements that are programmable to a plurality of physical states. The method includes applying to the word line a scanning sense voltage signal that spans a range of read reference levels for the plurality of physical states, determining a threshold voltage of each non-volatile storage element based on time-domain sensing while applying the scanning sense voltage signal, determining a plurality of hard bits and one or more soft bits for each non-volatile storage element based on a sensed threshold voltage from the scanning sense voltage signal, transferring from the non-volatile memory to the controller the plurality of hard bits and the one or more soft bits for each storage element, and performing an initial decode to determine data for the plurality of storage elements based on the plurality of hard bits and the one or more soft bits for each non-volatile storage element.

A method of reading non-volatile storage element is provided in accordance with one embodiment that includes identifying by a controller a word line of a non-volatile memory for storage of data from a host device. The word line is associated with a plurality of data bit sets and is in communication with a group of non-volatile storage elements. The method includes encoding the data by interleaved coding over the plurality of data bit sets of the word line, determining a plurality of target programming levels for the group of non-volatile storage elements based on the encoded data for the plurality of data bit sets, programming the group of storage elements by full sequence programming to a plurality of physical states based on a target programming level for each non-volatile storage element, and verifying programming of the plurality of storage elements to all of the physical states using time-domain sensing while applying a scanning sense voltage signal to the word line.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage device comprising:
   a non-volatile memory including a plurality of non-volatile storage elements configured to store a plurality of hard bits using a plurality of physical states;
   a plurality of word lines coupled to the plurality of non-volatile storage elements, each word line is associated with a plurality of bit sets including two or more hard bit sets and one or more soft bit sets;
   a controller in communication with the non-volatile memory, the controller configured to encode user data from a host device by interleaved coding across all of the hard bit sets associated with a selected word line and shape the user data over all of the physical states; and
   one or more read/write circuits configured to apply time-domain sensing to determine a threshold voltage of each non-volatile storage element of the selected word line using a continuous scanning voltage in response to a read request;
   wherein the controller receives in response to each read request a plurality of hard bits and one or more soft bits for each non-volatile storage element of the selected word line in a single sequence.

2. The non-volatile storage device of claim 1, wherein the one or more read/write circuits are configured to determine the plurality of hard bits and the one or more soft bits for each non-volatile storage element using the continuous scanning voltage in response to each read request from the controller.

3. The non-volatile storage device of claim 1, wherein:
   the controller is configured to perform an initial decode of the user data based on the plurality of hard bits and the one or more soft bits associated with the selected word line.

4. The non-volatile storage device of claim 3, wherein:
   the initial decode is a hard bit decode that uses the plurality of hard bits and the one or more soft bits for each storage element; and
   the controller is configured to perform one or more soft bit decodes based on the plurality of hard bits and the one or more soft bits in response to a failure of the hard bit decode.

5. The non-volatile storage device of claim 2, wherein the one or more read/write circuits are configured to determine the plurality of hard bits and the one or more soft bits for each non-volatile storage element using the continuous scanning voltage during a program verify sequence.

6. An apparatus, comprising:
   a group of non-volatile storage elements coupled to a word line; and
   one or more control circuits coupled to the group and the word line, the one or more control circuits configured to:
      apply to the word line a continuous scanning voltage signal that spans a range of read reference levels for a plurality of physical states;
      determine a threshold voltage of each non-volatile storage element based on time-domain sensing while applying the continuous scanning voltage signal;
      determine state information for each non-volatile storage element based on the threshold voltage from the time-domain sensing, wherein the state information exceeds a number of encoded bits in each non-volatile storage element;
      transfer from the non-volatile memory the state information for each storage element; and
      perform an initial decode to determine data for the plurality of storage elements based on the state information for each non-volatile storage element.

7. The apparatus of claim 6, wherein:
   the initial decode is a hard bit decode that uses a number of bits in the state information for each storage element that is equal to the number of encoded bits.

8. The apparatus of claim 7, wherein the one or more control circuits are configured to perform one or more soft bit decodes based on the state information after the initial decode, the one or more soft bit decodes use a number of bits in the state information for each storage element that exceeds the number of encoded bits.

9. The apparatus of claim 6, wherein:
   the state information includes a plurality of hard bits and one or more soft bits for each non-volatile storage element;
   the one or more control circuits include one or more read/write circuits configured to transfer the state information by transferring all of the hard bits for each non-volatile storage element from the memory together with the one or more soft bits for each non-volatile storage element; and
   the one or more control circuits include a controller configured to receive all of the hard bits and the all of the soft bits associated with the word line in a single sequence from the non-volatile memory.

10. The apparatus of claim 9, wherein:
    the one or more control circuits are configured to compress the soft bits associated with the word line prior to transferring the soft bits.

11. The apparatus of claim 6, wherein:
    the group of non-volatile storage elements is part of a non-volatile memory array; and
    the non-volatile memory array is arranged in a three dimensional structure.

* * * * *